(12) United States Patent
Imanaka et al.

(10) Patent No.: US 9,082,552 B2
(45) Date of Patent: Jul. 14, 2015

(54) METHOD OF MANUFACTURING CAPACITOR

(71) Applicant: FUJITSU LIMITED, Kawasaki-shi, Kanagawa (JP)

(72) Inventors: Yoshihiko Imanaka, Kawasaki (JP); Hideyuki Amada, Kawasaki (JP); Fumiaki Kumasaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 130 days.

(21) Appl. No.: 13/652,717

(22) Filed: Oct. 16, 2012

(65) Prior Publication Data
US 2013/0038981 A1 Feb. 14, 2013

Related U.S. Application Data

(63) Continuation of application No. PCT/JP2011/059159, filed on Apr. 13, 2011.

(30) Foreign Application Priority Data

Apr. 16, 2010 (JP) ................................. 2010-095017

(51) Int. Cl.
| | | |
|---|---|---|
| *H01G 7/00* | (2006.01) | |
| *H01G 4/12* | (2006.01) | |
| *H01G 13/00* | (2013.01) | |

(Continued)

(52) U.S. Cl.
CPC ............ *H01G 4/1227* (2013.01); *H01G 13/00* (2013.01); *H01L 23/49822* (2013.01); *H01L 23/49833* (2013.01); *H01L 23/50* (2013.01);
(Continued)

(58) Field of Classification Search
CPC ................................ H01G 4/30; H01G 4/232

USPC ............. 29/25.35–25.42, 25.03, 592.1, 29/830–832; 361/311–313, 306.1–306.3, 361/321.6
See application file for complete search history.

(56) References Cited

U.S. PATENT DOCUMENTS 5,335,139 A * 8/1994 Nomura et al. ............. 361/321.4
5,912,044 A * 6/1999 Farooq et al. ................ 427/79
(Continued)

FOREIGN PATENT DOCUMENTS

JP 2002-194560 A1 7/2002
JP 2002-344106 A1 11/2002
(Continued)

OTHER PUBLICATIONS

Y. Imanaka, et al.; "Passive Integration Technology for Microwave Application Using Aero-Sol Deposition;" Ceramics; vol. 39; No. 8; 2004; pp. 584-589 (6 Sheets).
(Continued)

*Primary Examiner* — Minh Trinh
(74) *Attorney, Agent, or Firm* — Kratz, Quintos & Hanson, LLP

(57) ABSTRACT

A method of manufacturing a capacitor includes forming, above a first metal foil, a first dielectric film of a ceramic material containing barium oxide by blowing dry ceramic particles to the first metal foil from a nozzle, forming, in the first dielectric film, a first via conductor connected to the first metal foil and a second via conductor connected to the first metal foil, forming, above the first dielectric film, a first electrode pattern connected to the first via conductor, and patterning the first metal foil to form a second electrode pattern connected to the second via conductor.

11 Claims, 19 Drawing Sheets

(51) Int. Cl.
*H01L 23/498* (2006.01)
*H01L 23/50* (2006.01)

(52) U.S. Cl.
CPC ............... *H01L2224/16225* (2013.01); *H01L 2224/16227* (2013.01); *Y10T 29/435* (2015.01)

(56) References Cited

U.S. PATENT DOCUMENTS

| | | | |
|---|---|---|---|
| 7,100,277 B2 * | 9/2006 | Borland et al. | 29/25.03 |
| 7,169,195 B2 * | 1/2007 | Sakaguchi et al. | 29/25.03 |
| 7,423,219 B2 * | 9/2008 | Kawaguchi et al. | 174/254 |
| 2004/0026030 A1 | 2/2004 | Hatono | |
| 2004/0227227 A1 | 11/2004 | Imanaka | |
| 2006/0287184 A1 | 12/2006 | Mori | |
| 2009/0273884 A1 * | 11/2009 | Shimizu et al. | 361/306.1 |

FOREIGN PATENT DOCUMENTS

| | | |
|---|---|---|
| JP | 2003-277949 A1 | 10/2003 |
| JP | 2005-5645 A1 | 1/2005 |
| JP | 2008-37739 A1 | 2/2008 |

OTHER PUBLICATIONS

Y. Imanaka, et al.; "Aerosol deposition for post-LTCC;" Journal of the European Ceramic Society; vol. 27; 2007; pp. 2789-2795 (7 Sheets)/p. 2 of specification.

International Search Report for International Application No. PCT/JP2011/059159 dated Jul. 26, 2011.

\* cited by examiner

METHOD OF MANUFACTURING CAPACITOR

CROSS-REFERENCE TO RELATED APPLICATION

This application is a continuation application of International Application PCT/JP2011/059159 filed on Apr. 13, 2011 and designated the U.S., the entire contents of which are incorporated herein by reference.

FIELD

The embodiments discussed herein are related to a capacitor and method of manufacturing a capacitor.

BACKGROUND

For the downsizing and high performance of electronic devices, the mounting technology as well is required to intend the high performance. Presently, in the mounting packages used for the elements of PCs, servers, etc., decoupling capacitors, etc. are arranged around the elements for the current supply upon source voltage drops, noise removal, etc. This function becomes increasingly important as the elements become speedy and have lower drive voltage.

To speedily make the current supply, it is necessary to make low the impedance of the decoupling capacitor and the source power supply system. For this end, a capacitor of high capacitance and low inductance, and the decrease of the capacitor interconnection length are required. The arrangement position of the capacitor directly below the element is most effective, and a package with the capacitor incorporated is required. This is effective also for lowering the cost, and such package is expected.

As the method of incorporating a capacitor are proposed various methods, such as the method of burying the capacitor components in a package, the method of forming a capacitor film, etc. Among them, the method of patterning films to form a capacitor permits the capacitor to be arranged selectively at a required part inside the circuit, and it is most expected to use this method to incorporate the film capacitor.

Presently, the widely generally used package is formed of an epoxy resin-based material. On the other hand, the capacitor is formed of a barium titanate-based dielectric ceramics. The process temperature for forming ceramics is not less than 1000° C., and it is considered impossible to directly introduce ceramic film during the process of manufacturing the resinous package whose heat resistance temperature is about 250° C.

The followings are examples of related: Japanese Laid-open Patent Publication No. 2002-194560; Japanese Laid-open Patent Publication No. 2003-277949; Y. Imanaka and J. Akedo, Technique of RF passive element integration by aerosol deposition, Ceramics, Vol. 39, No. 8, pp. 584-589 (2004); and Y. Imanaka, N. Hayashi, M. Takenouchi and J. Akedo, Aerosol deposition for post-LTCC, Journal of the European Ceramic Society 27 (2007), pp. 2789-2795.

As the process of forming dielectric ceramic film are sputtering method, sol-gel method, etc. The film deposited by sputtering method is subjected to thermal processing at a temperature of not less than about 600° C. to crystallize and densify the as-deposited amorphous film. The film deposited by sol-gel method is also subjected to thermal processing for evaporating the solvent after alkoxide liquid has been applied. Resultantly, thermal shrinkage, thermal stresses, etc. are generated in such thermal processing, and cracks and micro-cracks are often formed in the film. Especially when the film thickness is thin, it is difficult to form film of good quality.

In the method of forming a capacitor structure by a dielectric ceramics film above a substrate having a smooth surface, such as a silicon wafer, a sapphire waver or others, the film stress is not uniformed due to the presence of the substrate in the base, and in a multilayer of a certain number of layers, inter-layer peelings often takes place. The presence of the substrate in the base lowers the degree of freedom of leading out the terminal, and the impedance of the whole containing systems, such as the arrangement of the lead electrode, etc. often increases.

SUMMARY

According to one aspect of an embodiment, there is provided a method of manufacturing a capacitor including forming, above a first metal foil, a first dielectric film of a ceramic material containing barium oxide by blowing dry ceramic particles to the first metal foil from a nozzle, forming, in the first dielectric film, a first via conductor connected to the first metal foil and a second via conductor connected to the first metal foil, forming, above the first dielectric film, a first electrode pattern connected to the first via conductor, and patterning the first metal foil to form a second electrode pattern connected to the second via conductor.

According to another aspect of an embodiment, there is provided a method of manufacturing a capacitor including forming a plurality of first substrates each including a first dielectric film with a first via conductor and a second via conductor buried in and a first electrode pattern connected to the first via conductor by forming, above a first metal foil, the first dielectric film of a ceramic material containing barium oxide by blowing dry ceramic particles to the first metal foil from a nozzle, forming, in the first dielectric film, the first via conductor connected to the first metal foil and the second via conductor connected to the first metal foil, forming, above the first dielectric film, the first electrode pattern connected to the first via conductor, and removing the first metal foil, forming a plurality of second substrates each including a second dielectric film with a third via conductor and a fourth via conductor buried in and a second electrode pattern connected to the third via conductor by forming, above a second metal foil, the second dielectric film of a ceramic material containing barium oxide by blowing dry ceramic particles to the first metal foil from a nozzle, forming, in the second dielectric film, the third via conductor connected to the second metal foil and the fourth via conductor connected to the second metal foil, forming, above the second dielectric film, the second electrode pattern connected to the third via conductor, and removing the second metal foil, and repeatedly stacking the first substrate and the second substrate with the first electrode pattern connected alternately to the first via conductor and the fourth via conductor and with the second electrode pattern alternately connected to the third via conductor and the second via conductor.

According to further another aspect of an embodiment, there is provided a capacitor including a layer structure including a plurality of electrode layers formed of copper and a plurality of dielectric layers formed of a ceramic material containing barium oxide alternately stacked, a first through-via formed through the layer structure and electrically connecting odd-number-th layers of the electrode layers to each other, and a second through-via formed through the layer structure and electrically connecting even number-th layers of the electrode layers to each other.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

A capacitor and a method of manufacturing the capacitor according to a first embodiment will be described with reference to FIGS. 1 to 10.

Figure 1:
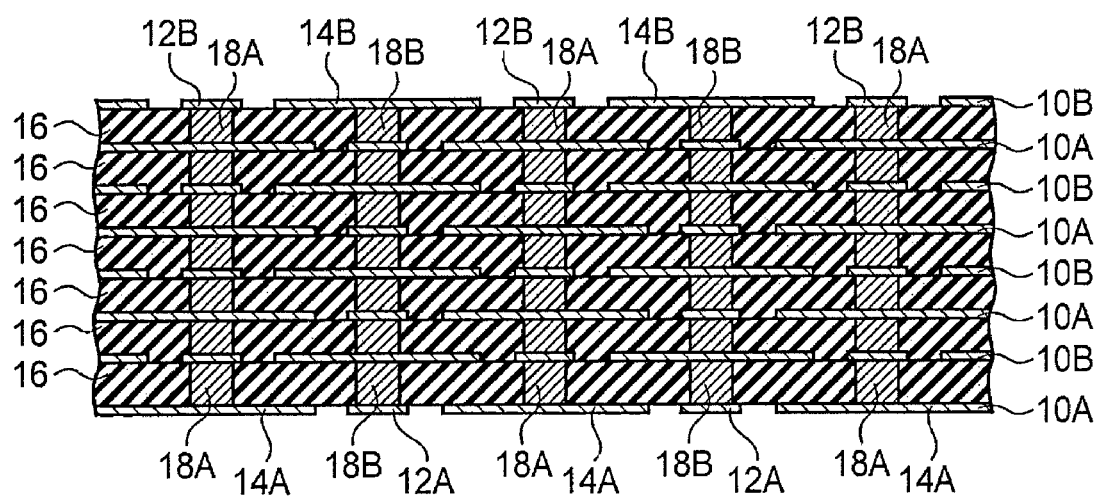
FIG. 1 is a diagrammatic cross-sectional view illustrating a structure of a capacitor according to a first embodiment.
Figure 2A:
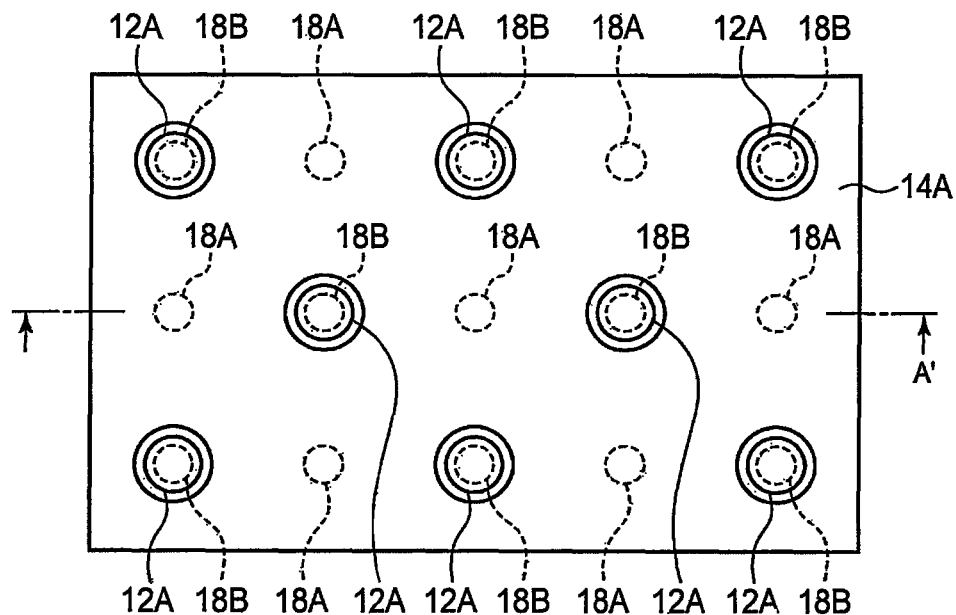
FIGS. 2A and 2B are plan views illustrating the structure of the capacitor according to the first embodiment.
Figure 2B:
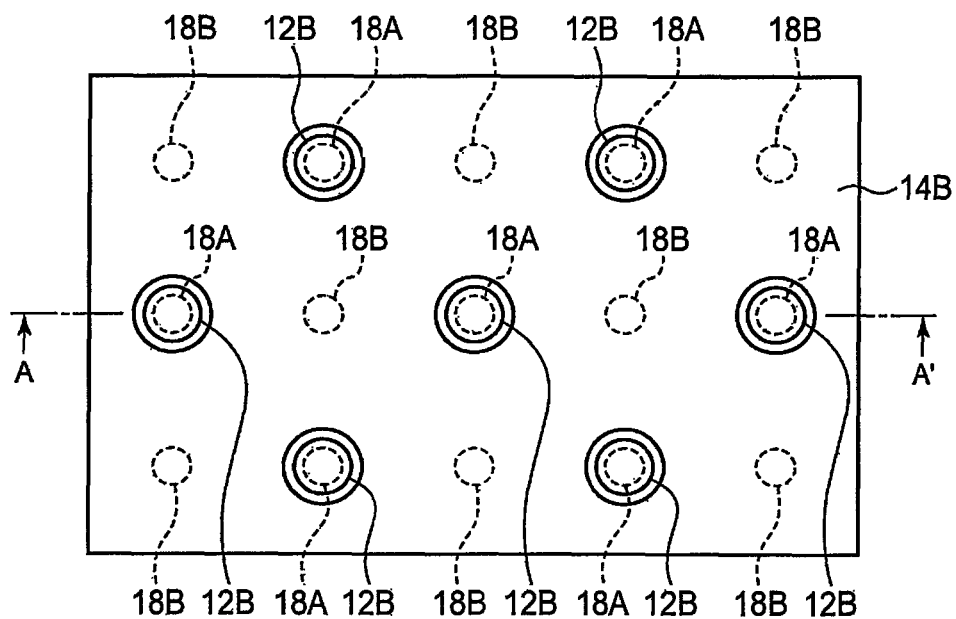
Figure 8:
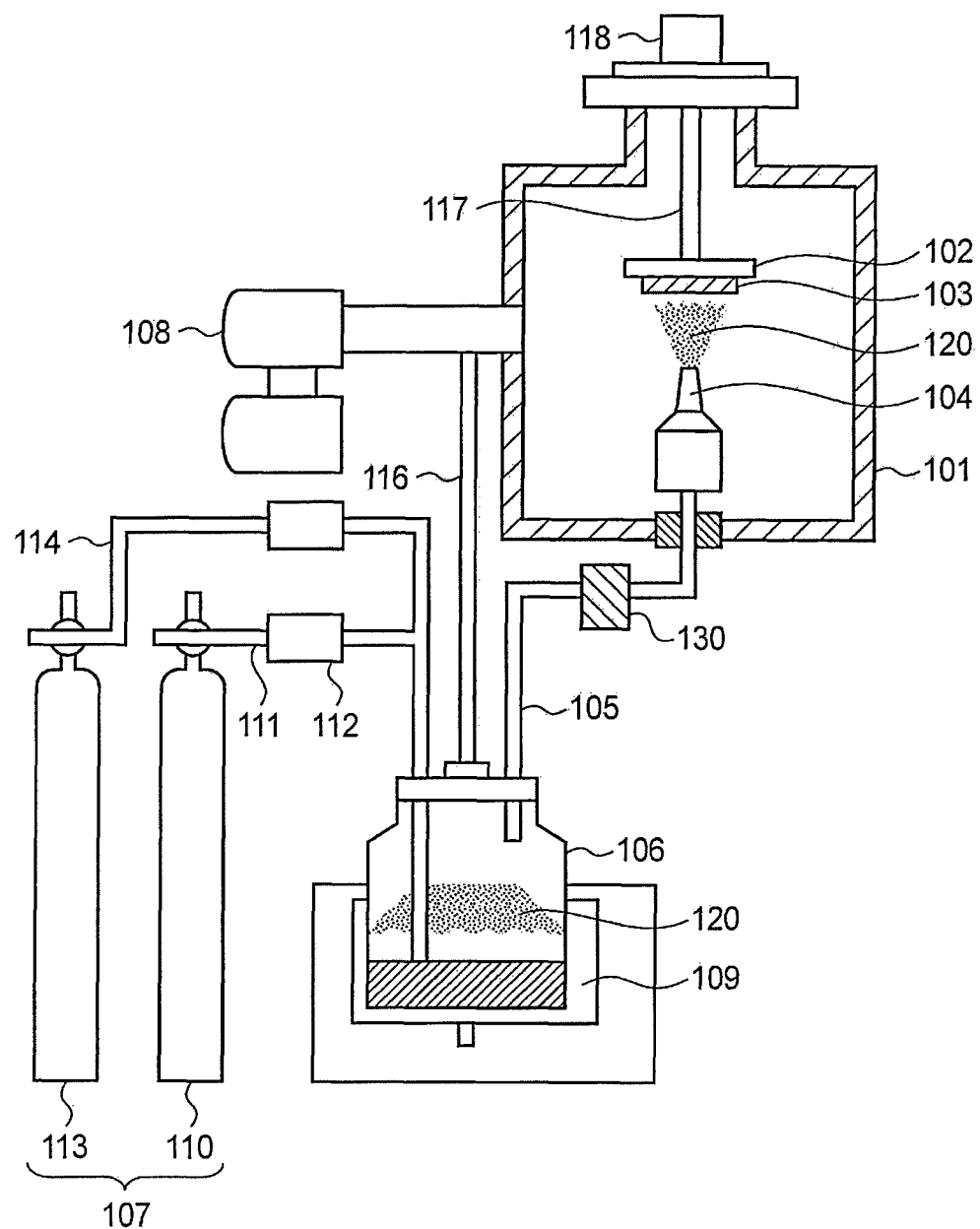
FIG. 8 is a diagrammatic view illustrating a structure of aerosol deposition system.
Figure 9A:
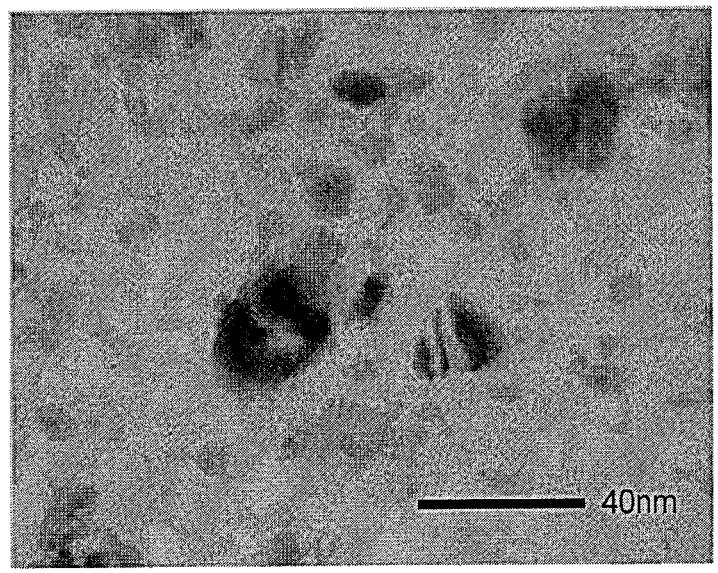
FIGS. 9A, 9B and 10 are TEM images of an aerosol deposition film.
Figure 9B:
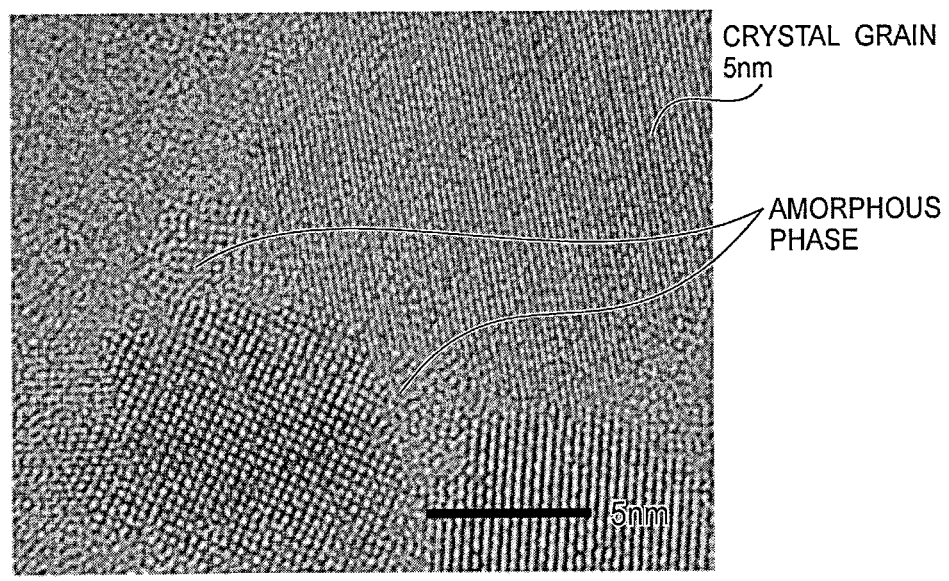
Figure 10:
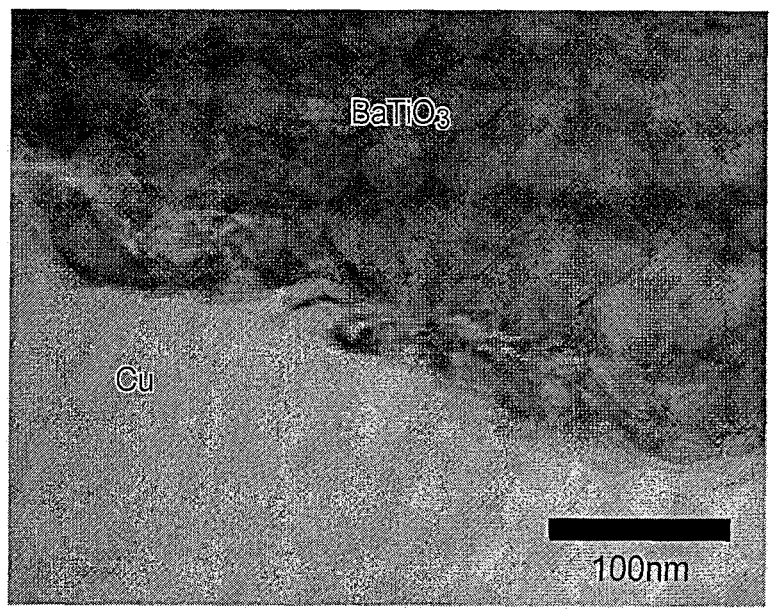

FIG. 1 is a diagrammatic cross-sectional view illustrating the structure of the capacitor according to the present embodiment. FIGS. 2A and 2B are plan views illustrating the structure of the capacitor according to the present embodiment. FIGS. 3A-7C are cross-sectional views illustrating the method of manufacturing the capacitor according to the present embodiment. FIG. 8 is a diagrammatic view illustrating a structure of aerosol deposition system. FIGS. 9A, 9B and 10 are TEM images of an aerosol deposition film.

First, the structure of the capacitor according to the present embodiment will be described with reference to FIGS. 1 to 2B.

As illustrated in FIG. 1, the capacitor according to the present embodiment includes a plurality of electrode layers 10 and a plurality of dielectric layers 16 alternately stacked.

The plurality of electrode layers 10 include a plurality of first electrode layers 10A and a plurality of the second electrode layers 10B. As exemplified in FIG. 2A, the first electrode layer 10A has a plurality of via patterns 12A laid out zig-zag and a grid-shaped electrode pattern 14A having openings laid out so as to isolate the grid-shaped electrode pattern 14A from the via patterns 12A. Similarly, the second electrode layer 10B has a plurality of via patterns 12B laid out zig-zag and a grid-shaped electrode pattern 14B having openings laid out so as to isolate the grid-shaped electrode pattern 14B from the via patterns 12B. The via patterns 12A of the first electrode layer 10A and the via patterns 12B of the second electrode layer 10b are laid out, offset from each other.

The first electrode layers 10A and the second electrode layers 10B are stacked alternately with the dielectric layers 16 arranged therebetween. The electrode patterns 14A of the plurality of first electrode layers 10A are connected to each other via the via conductors 18A buried in the dielectric layers 16 and the via patterns 12B. The electrode patterns 14B of the plurality of second electrode layers 10B are connected to each other via the via conductors 18B buried in the dielectric layers 16 and the via patterns 12A. In other words, the electrode patterns of the odd-number-th electrode layers (the electrode patterns 14A) are connected to each other via the via conductors 18A, and the electrode patterns of the even-number-th electrode layers (the electrode patterns 14B) are connected to each other via the via conductors 18B.

Thus, a capacitor including the electrode patterns 14A of the plurality of first electrode layers 10A as one electrodes, the electrode patterns 14B of the plurality of second electrode layers 10B as the other electrodes, and the dielectric layers 16 between these electrodes as the capacitor dielectric film is formed.

As illustrated in FIG. 1, the structure of the electrode patterns 14A, the via conductors 18A and the via patterns 12B repeatedly stacked functions also as the through-vias passed through the capacitor. Similarly, the structure of the electrode patterns 14B, the via conductors 18B and the via patterns 12A repeatedly stacked functions also as the through-vias passed through the capacitor.

The dielectric layers can be formed of a dielectric material of, e.g., ceramics containing barium oxide, for example, barium titanate-based ceramics as the main composition although not specifically limited. The barium titanate-based ceramics can be $BaTiO_3$, or $BaTiO_3$ having a part of the sites of Ba substituted by at least 1 species of element selected from the group consisting of alkaline earth elements (Sr, Ca, etc.) and rare earth elements (Y, La, Ce, Pr, Nd, Sm, Gd, Dy and Er). A part of the Ti sites of these barium titanate-based ceramics can be substituted by at least 1 species of element selected from the group consisting of V, Nb, Ta and Zr.

The electrode layers and the via conductors can be formed of a conductive material containing at least 1 species selected from the group consisting of, e.g., copper, gold, platinum, aluminum, tungsten, molybdenum, nickel, chrome, titanium, palladium, iron and alloys of them. By the method of manufacturing the capacitor according to the present embodiment, which will be described later, the electrode layers and the via conductors can be formed of a metal material (e.g., copper) of a melting point lower than the general anneal temperature of barium titanate-based ceramics material (about 1300° C.-1400° C.), and fine through-via structures can be formed.

Thus, the internal interconnections of the capacitor can be formed of a metal material of high conductivity, such as copper or others, whereby in combination with the use of the through-via structure, a capacitor of low impedance and inductance can be realized. The capacitance can be suitably controlled by layer numbers of the electrode layers and the dielectric layers, whereby a capacitor of large capacitance can be easily realized.

The capacitor illustrated in FIG. 1 includes, as one example, 8 layers of the electrode layers and 7 layers of the dielectric layers alternately stacked, but the layer numbers of the electrode layer and the dielectric layer are not limited to this. The capacitor may include at least 1 layer of the dielectric layer and 2 layers of the electrode layers sandwiching the dielectric layer.

Next, the method of manufacturing the capacitor according to the present embodiment will be described with reference to FIGS. 3A to 10. In the following description, the constituent materials of the metal foil, the electrode layers and the via conductors are formed of copper, but can be suitably changed as long as the materials have melting points higher than the anneal temperature of aerosol deposition film. The metal foil to be a body-to-be-deposited-on in depositing film acts as the seed layer for forming the plating vias in a later step. In the case, however, that for forming the via conductors, electroplating is not used, and annealing is finally made, a resin sheet or others may be used instead of metal foil.

Figure 3A:
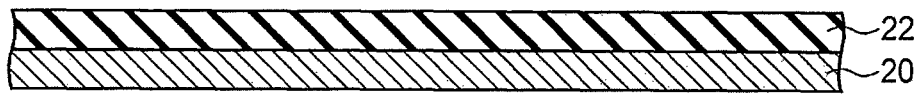
FIGS. 3A-3E, 4A-4E, 5A-5D, 6A-6C and 7A-7C are cross-sectional views illustrating a method of manufacturing a capacitor according to the first embodiment.

First, an aerosol deposition film 22 of, e.g., a 2 μm-thickness barium titanate is deposited above a copper foil 20 of, e.g., a 35 μm-thickness (FIG. 3A). The aerosol deposition film 22 is a film of crystallites of barium titanate of nano-level. Aerosol deposition method is a method of deposition by blowing dry particles from a nozzle.

The deposition of barium titanate by aerosol deposition method can be made with the aerosol deposition system exemplified in FIG. 8.

The aerosol deposition system illustrated in FIG. 8 includes a deposition chamber 101 including a substrate holder 102 which holds a deposition substrate 103 and a deposition nozzle 104. To the deposition chamber 101, an aerosol generator 106 supplying material particles in aerosol state via an aerosol pipe 105 and a carrier gas supplier 107 supplying the carrier gas to the aerosol generator 106 are connected. On the way of the aerosol pipe 105, a surface amorphous layer forming device 130 which fractures the material particles carried from the aerosol generator 106 into fine particles and forms an amorphous layer on the surfaces of the fine particles is provided.

To the deposition chamber 101, a vacuum pump 108 is connected. The vacuum pump 108 is connected also to the aerosol generator 106 via a pipe 116. A supersonic vibrator 109 is provided in the aerosol generator 106. The carrier gas supplier 107 includes an oxygen gas tank 110, a pipe 111 interconnecting the oxygen gas tank 110 and the aerosol generator 106, and a flow meter (MFC) 112 provided in the way of the pipe 111 between the oxygen gas tank 110 and the aerosol generator 106. The carrier gas supplier 107 also has a nitrogen gas tank 113, a pipe 114 interconnecting the nitrogen gas tank 113 and the aerosol generator 106, and a flow meter 115 provided in the way of the pipe 114 between the nitrogen gas tank 113 and the aerosol generator 106. The substrate holder 102 includes an X-Y-Z-θ stage 118 provided via a support 117, whereby the deposition can be made while the deposition substrate 103 is being moved.

The method of depositing the aerosol deposition film 22 with the aerosol deposition system illustrated in FIG. 8 will be described.

First, barium titanate powder of, e.g., a 0.5 μm-average particle diameter is fed into the aerosol generator 106 and is degassed in vacuum for, e.g., 30 minutes at, e.g., 150° C. while supersonic waves are being applied to the whole container by the supersonic vibrator 109. Thus, the water adhering to the particle surfaces is removed. It is possible to make in advance thermal processing for removing impurities adhering to the particle surfaces, such as adsorbed water, undecomposed substances, organic impurities, etc., making the crystal structure of the powder particles uniform and removing strains and stresses of the particles.

Next, into the aerosol generator 106, high purity oxygen gas is fed at, e.g., a 2 kg/cm$^2$ gas pressure and, e.g., a 4 L/minute flow rate to apply ascending currents, and mixed aerosol with oxygen is formed. This mixed aerosol is classified and reformed by the surface amorphous layer deposition chamber 130 and then is ejected from the deposition nozzle 104 onto the copper foil 20 to be deposited while the substrate holder 102 is being scanned in prescribed direction. The aerosol to be ejected contains no liquid. The material particles are combined into film by the action of the amorphous layer of high surface energy, of the material particles ejected onto the copper foil 20, and the aerosol deposition film 22 can be formed. At this time, the deposition chamber 102 is evacuated in advance to, e.g., not more than 10 Pa, and in the deposition, the pressure of the deposition chamber 101 is retained at, e.g., 200 Pa.

Under the above-described conditions, the mixed aerosol is ejected onto the surface of the copper foil 20 for, e.g., 2 minutes, whereby the aerosol deposition film of, e.g., a 2 μm-thickness can be formed (the deposition rate: about 1±0.5 μm/min).

FIGS. 9A, 9B and 10 are transmission electron microscope (TEM) images of the aerosol deposition film 22 deposited under the above-described conditions. FIG. 9B is the enlarged view of FIG. 9A.

As illustrated in FIGS. 9A and 9B, inside the film of the as-deposited aerosol deposition film, large diameter particles of about 100 nm (about 50 nm-300 nm) and small diameter particles of about 10 nm (about 1 nm-20 nm) are contained, and an amorphous layer (crystal disturbance, disordered layer) of not less than about 1 nm is formed. As illustrated in FIG. 10, in the interface between the copper foil and the aerosol deposition film, roughness of not more than about 500 nm are present. This is an interlocking layer between the copper foil and the aerosol deposition film and have the effect to increase the adhesion between the copper foil and the aerosol deposition film. The relative density of the aerosol deposition film 22 deposited under the above-described conditions was not less than about 90%. The respective particles have good crystallinity, and no continuous defects and distortions, such as dislocation loops, etc., are not formed inside the particles of the film.

Figure 3B:

Then, thermal processing is made in a nitrogen atmosphere at about 800° C.-1050° C., e.g., 1000° C. for 30 minutes to anneal the aerosol deposition film 22 to form the barium titanate film 24 (FIG. 3B). The barium titanate film 24 is a dense film of crystallites of barium titanate contained in the aerosol deposition film 22 particle-grown by annealing.

The aerosol deposition film 22 deposited by the aerosol deposition system illustrated in FIG. 8 is formed by jetting material particles subjected to the reforming process for forming an amorphous layer (crystal disturbances, disordered layers) in the surface. The material particles thus deposited have no strains and defects in the inside crystal structure, and can extremely lower stresses introduced into the aerosol deposition film 22. The relative density of the film deposited by aerosol deposition method is high, and the volume changes accompanying the thermal processing can be suppressed. Thus, the stress to be applied to the copper foil 20 can be reduced, and the barium titanate film 24 which is dense and free from strains can be formed above the copper foil 20.

For the aerosol deposition film 22 thus deposited, the thermal processing for forming the barium titanate film 24 can be made at a temperature of about 800° C.-1050° C. lower than the melting point of copper (about 1085° C.). This permits copper of low resistance to be used as the internal interconnections of the capacitor. For example, when the barium titanate film deposited at the room temperature is porous, the film shrinks in the thermal processing, and dense film of good adhesion cannot be formed above the copper foil. When many strains are present in the barium titanate film deposited at the room temperature, the strains are released in the thermal processing, and film of high adhesiveness cannot be formed.

Figure 3C:
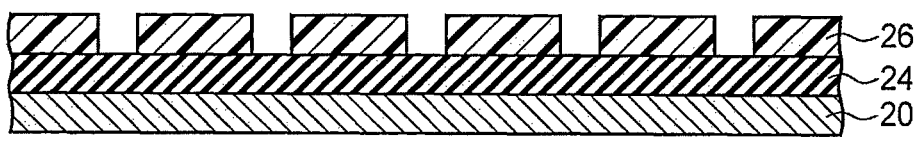

Next, a photoresist film 26 exposing the via holes forming regions is formed above the barium titanate film 24 by photolithography (FIG. 3C).

Then, the barium titanate film 24 is etched by wet etching with an etchant containing, e.g., hydrofluoric acid and nitric acid with the photoresist film 26 as the mask to form the via holes 28 reaching down to the copper foil 20 in the barium titanate film 24.

Figure 3D:
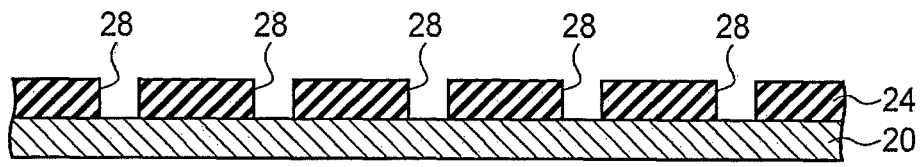

Next, by, e.g., ashing method, the photoresist film 26 is removed (FIG. 3D).

Figure 3E:
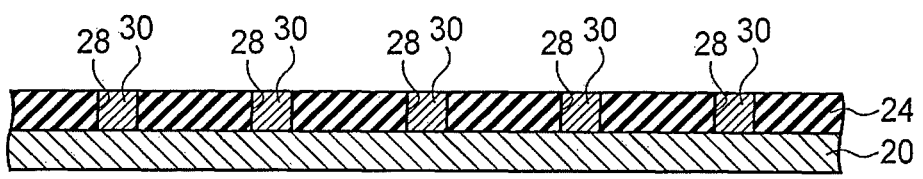

Next, electroplating is made with the copper foil 20 as the seed layer to form the via conductors 30 in the via holes 28 (FIG. 3E). To form these via conductors, the electroplating is not essential, and electroless plating, sputtering, evaporation, aerosol deposition, glass deposition, powder filling or others may be used.

The thermal processing for forming the barium titanate film (the dense film having the particle grown by annealing) 24 from the aerosol deposition film (the crystallite film of nano-level) 24 cannot be made essentially immediately after deposited. For example, after the via holes 28 have been formed in the aerosol deposition film 22, the thermal processing may be made to form the barium titanate film 24. After the via conductors 30 are formed in the via holes 28 formed in the aerosol deposition film 22, thermal processing may be made to form the barium titanate film 24 having the particles grown.

The opening of the via holes 28 in the barium titanate film (the barium titanate film after annealed) (or the aerosol deposition film 22) may be made by laser irradiation or others. When a laser is used, power is applied to the barium titanate film 24 while being reflected on the copper foil 20, and the via holes 28 can be formed in the barium titanate film 24 without passing through the copper foil 20.

To form the via holes 28 in the barium titanate film 24, lift off method using a resist or others may be used. For example, a resist is formed in the via hole forming regions, then the film is formed by aerosol deposition method, and the resist is removed, whereby the via holes can be formed. The ceramic particles applied in the aerosol deposition do not adsorb to the surface of the resin of the resist, etc., and the resin layer is not broken by the aerosol particles. The resist can be easily peeled by a solvent or others. The dummy layer to be used in the lift off method is not limited to a resist, and rubber-based resins, inorganic materials or others which can be patterned are usable.

Figure 4A:
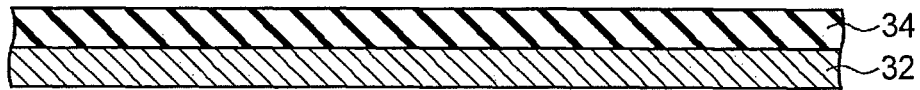

Next, by the same procedures, another copper foil 32 different from the copper foil 20, the aerosol deposition film 34 of barium titanate of, e.g., a 2 µm-thickness is deposited (FIG. 4A).

Figure 4B:
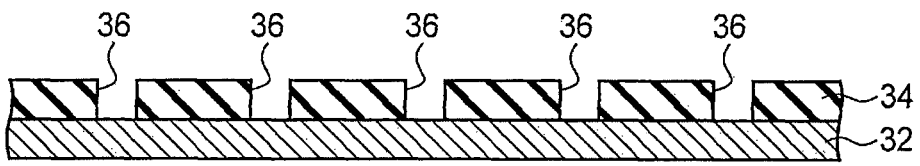

Then, the via holes 36 are formed in the aerosol deposition film 34 by photolithography and wet etching (FIG. 4B). The via holes 36 may be formed by laser irradiation or others, as are the via holes 28.

Figure 4C:
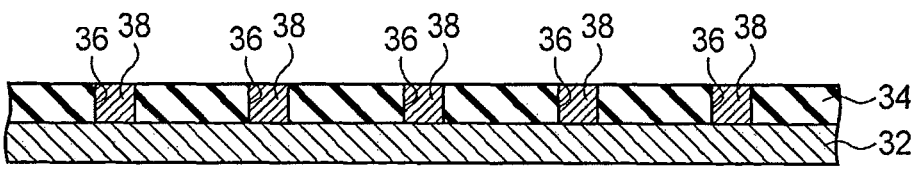

Next, with the copper foil 32 as the seed layer, copper electroplating is made to form the via conductors 38 in the via holes 36 (FIG. 4C).

Next, the copper film 40 of, e.g., a 0.5 µm-thickness is formed above the aerosol deposition film 34 with the via conductors 38 buried in by, e.g., sputtering method. The copper film 40 may be formed by, other than sputtering method, plating method, electroless plating method or others. It is also possible that the via conductors 38 are formed by the copper film 40.

Next, by photolithography and dry etching, the copper film 40 is patterned to form the via patterns 12A and the electrode patterns 14A connected to the via conductors 38.

Figure 4D:
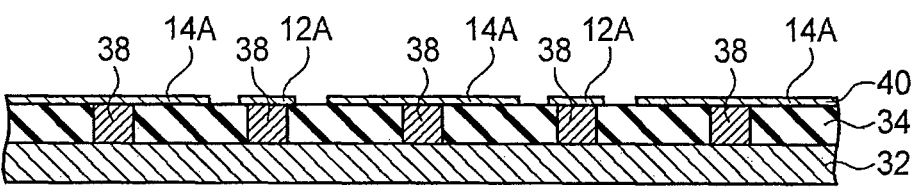

Thus, a plurality of the copper foils 32 with the aerosol deposition film 34 with the via conductors 38 buried in, and the copper film 40 including the via patterns 12A and the electrode patterns 14A are prepared (FIG. 4D).

Figure 4E:
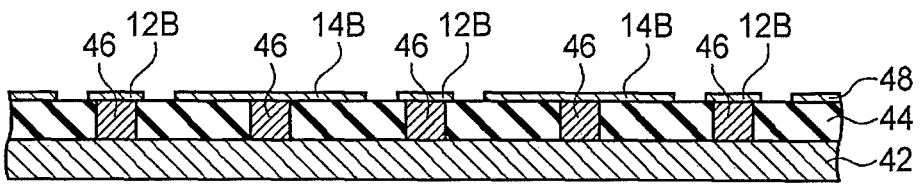

In the same way as illustrated in FIGS. 4A to 4D, a plurality of the copper foils 42 with the aerosol deposition film 44 with the via conductors 46 buried in and the copper film 48 including the via patterns 12B and the electrode patterns 14B are prepared (FIG. 4E).

Figure 5A:
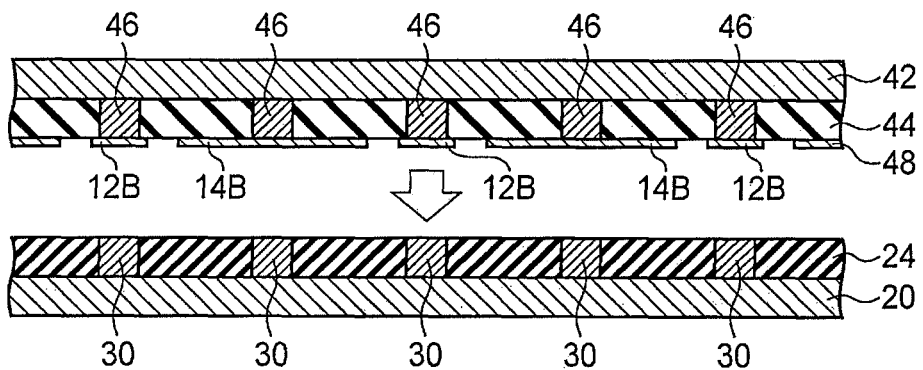

Next, the copper foil 42 with the aerosol deposition film 44 and the copper film 48 formed is superposed above the copper foil 20 with the barium titanate film 24 and the via conductors 30 formed with the via conductors 30 connected to the via patterns 12B and the electrode patterns 14B (FIG. 5A).

Figure 5B:
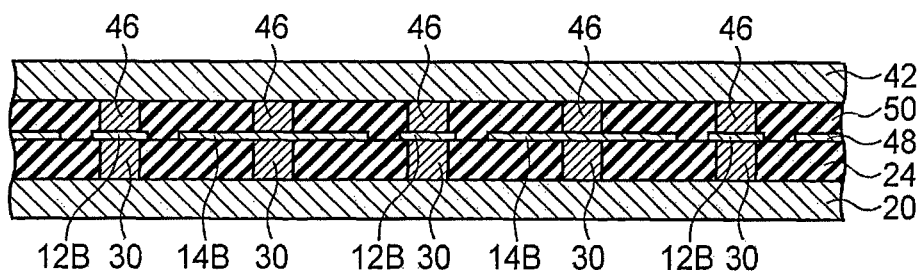

Next, while a pressure is being applied between the copper foil 20 and the copper foil 42, thermal processing is made in, e.g., a nitrogen atmosphere and at about 800° C.-1050° C., e.g., 1000° C. for 30 minutes to anneal the aerosol deposition film 44 to form the barium titanate film 50, and the barium titanate films 24, 50 are jointed (FIG. 5B). For this thermal processing, the method of annealing with heat of a heater, hot press, SPS method, millimeter wave annealing or microwave annealing, with a uniaxial pressure being applied, may be used.

In the stacking, uniaxial press, rubber press or others can be used. Otherwise, in the lamination, the layers are superposed merely mechanically, and a certain weight may be merely applied. The thermal processing is made preferably in a non-oxidizing atmosphere for preventing the oxidation of copper.

In the integration annealing, a compound layer for facilitating the junction may be formed between the barium titanate film 24 and the aerosol deposition film 44. As such compound layer, a Li, Bi or Ge-based compound, e.g., $Pb_5Ge_3O_{11}$, $LiF$, $Bi_2O_3$, $Li_2Bi_2O_5$ or others can be used. For forming such compound layer, the deposition by aerosol deposition, the process of applying the compound onto the surface while polishing is made to planarize the surface, or others can be used.

Figure 5C:
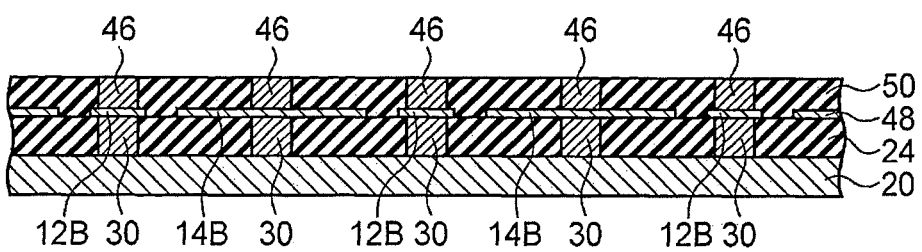

Then, the copper foil 42 is removed with, e.g., ferric chloride aqueous solution (FIG. 5C).

Figure 5D:
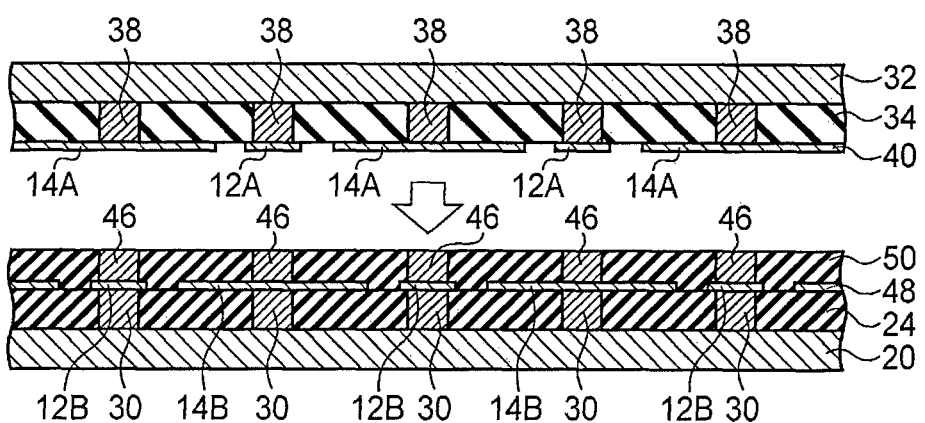

Then, the copper foil 32 with the aerosol deposition film 34 and the copper film 40 formed is superposed above the barium titanate film 50 with the via conductors 46 buried in with the via conductors 46 connected to the via patterns 12A and the electrode patterns 14A (FIG. 5D).

Figure 6A:
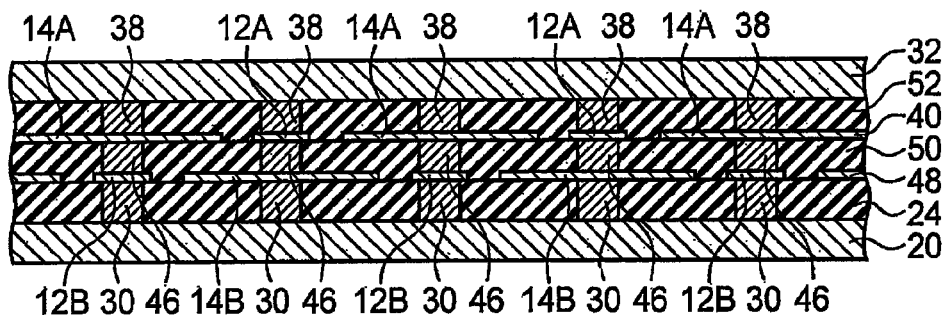

Next, while a pressure is being applied between the copper foil 20 and the copper foil 32, thermal processing is made in, e.g., a nitrogen atmosphere and at about 800° C.-1050° C., e.g., 1000° C. for 30 minutes to anneal the aerosol deposition film 34 to form the barium titanate film 52, and the barium titanate films 50, 52 are jointed (FIG. 6A). For the integration annealing, a compound layer for facilitating the joint may be formed between the barium titanate film 50 and the aerosol deposition film 34.

Figure 6B:
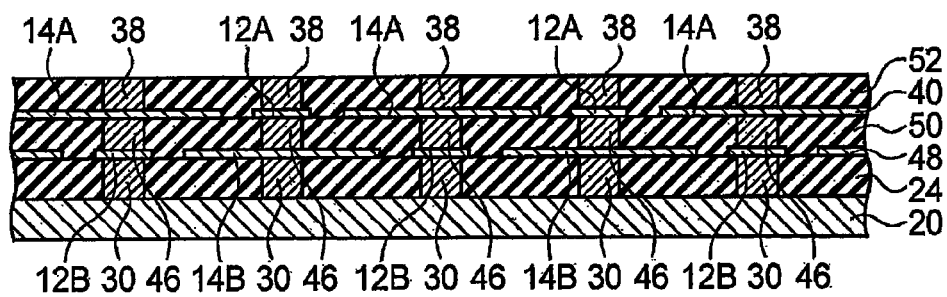

Then, the copper foil 32 is removed with, e.g., ferric chloride aqueous solution (FIG. 6B).

It is not necessary to completely remove the copper foil 32. It is possible that the copper foil 32 is half-etched to, e.g., an about 1 µm-thickness and then is patterned into the via patterns 12B and the electrode patterns 14B.

Figure 6C:
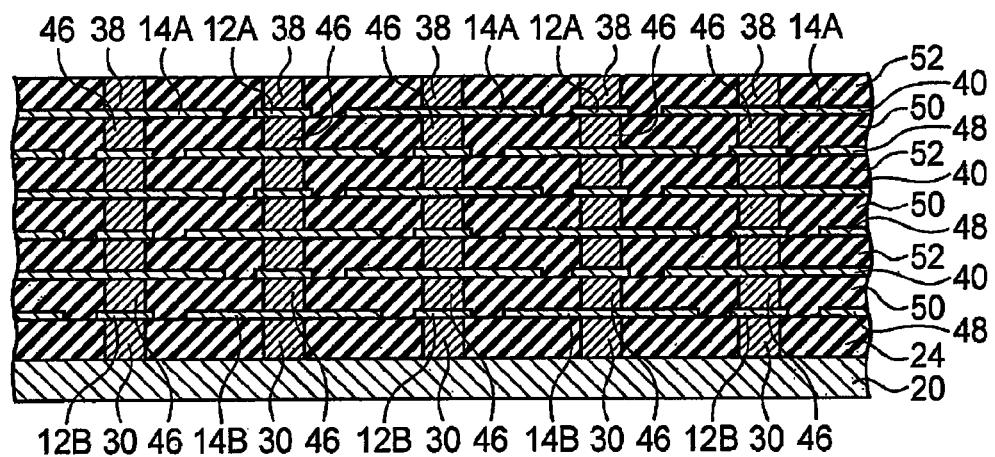

Then, in the same way as in the steps of FIG. 5A to FIG. 6B, above the barium titanate film 52 with the via conductors 38 buried in, the copper film 48 and the barium titanate film 50, and the copper film 40 and the barium titanate film 52 are stacked repeatedly (e.g., twice here) (FIG. 6C).

Next, the copper film 54 of, e.g., a 0.5 µm-thickness is formed above the uppermost barium titanate film 52 with the via conductors 38 buried in by, e.g., sputtering method.

Figure 7A:
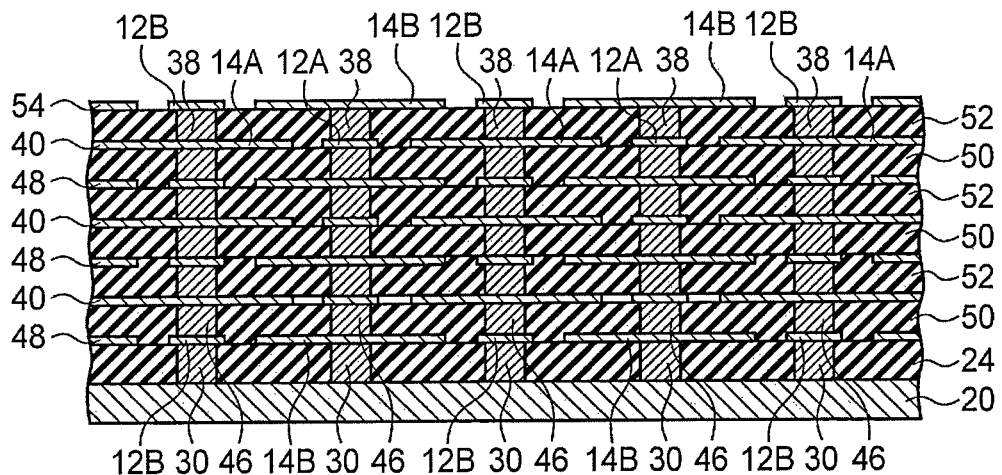

Then, the copper film 54 is patterned by photolithography and dry etching to form the via patterns 12B and the electrode patterns 14B connected to the via conductors 38 (FIG. 7A).

Figure 7B:
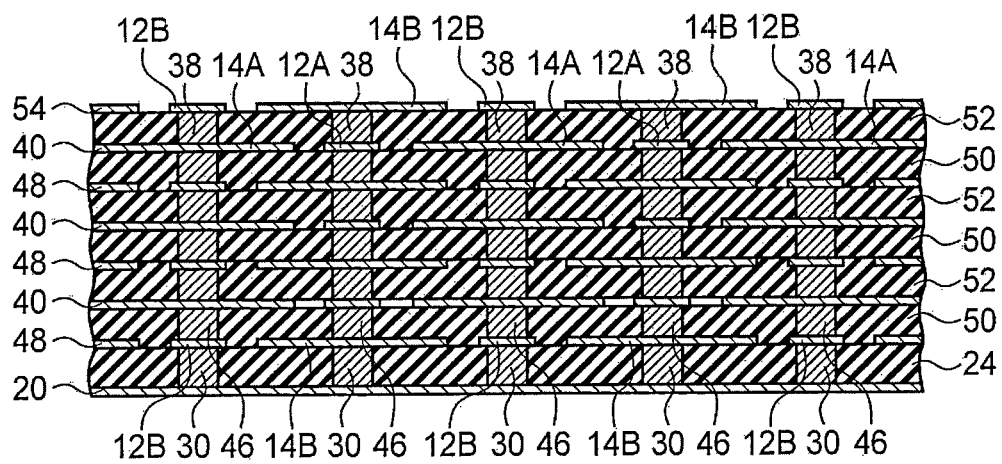

Then, the copper foil 20 is half-etched with, e.g., ferric chloride water solution to an about 1 µm-thickness (FIG. 7B). The half-etching of the copper foil 20 is not essential.

Figure 7C:
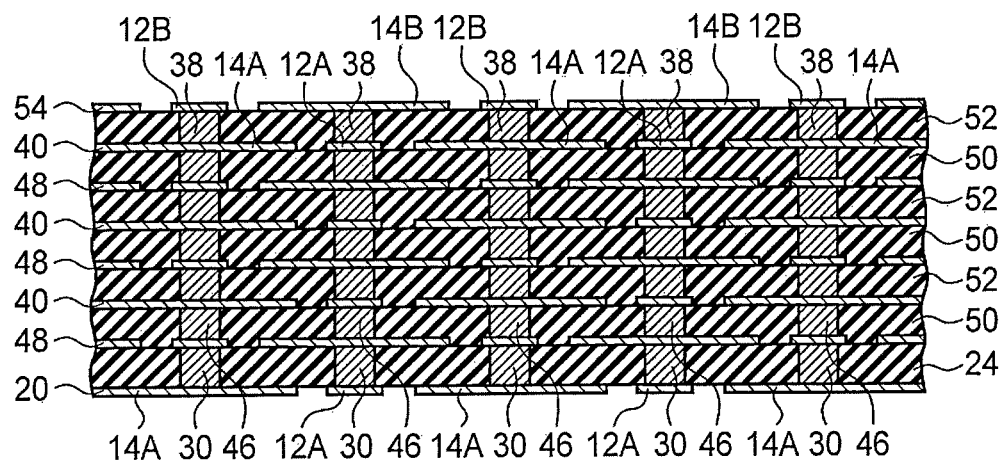

Next, the thinned copper foil 20 is patterned by photolithography and dry etching to form the via patterns 12A and the electrode patterns 14A connected to the via conductors 30 (FIG. 7C).

Thus, the capacitor according to the present embodiment illustrated in FIG. 1 is completed.

As described above, according to the present embodiment, the capacitor is formed by stacking the plurality of substrates each including a barium titanate film deposited by aerosol deposition method and an electrode layer, whereby the annealing temperature can be lowered, and the stress accompanying the annealing can be suppressed. Consequently, the internal interconnections can be formed of a metal material of low resistance, such as copper or others, and the impedance and the inductance can be decreased. The stacked layer number can be easily increased, and the capacitance of the capacitor can be drastically increased.

A Second Embodiment

A capacitor and a method of manufacturing the capacitor according to a second embodiment will be described with reference to FIGS. 11A to 12C. The same members of the present embodiment as those of the capacitor and the method of manufacturing the same illustrated in FIGS. 1 to 10 are represented by the same reference numbers not to repeat or to simplify the description.

FIGS. 11A-12C are cross-sectional views illustrating the method of manufacturing the capacitor according to the present embodiment.

In the present embodiment, another method of manufacturing the capacitor according to the first embodiment illustrated in FIG. 1 will be described.

In the same way as in the method of manufacturing the capacitor according to the first embodiment, the aerosol deposition film 44, the via conductors 46 buried in the aerosol deposition film 44 and the copper film 48 are formed above the copper foil 42.

Then, thermal processing is made in a nitrogen atmosphere at 800° C.-1050° C., e.g., 1000° C. for 30 minutes to anneal the aerosol deposition film 44 to form the barium titanate film 50. This thermal processing may not be made essentially after the copper film 48 has been formed as long as after the aerosol deposition film 44 has been deposited.

Thus, the copper foil 42 with the barium titanate film 50 with the via conductors 46 buried in, and the copper film 48 including the via patterns 12B and the electrode patterns 14B formed is prepared. The barium titanate film 50 with the via conductors 46 buried in, and copper foil 42 including the via patterns 12B and the electrode patterns 14B can be before the thermal processing and can be the aerosol deposition film 44 with the via conductors 46 buried in, and the copper film 48 with the via patterns 12B and the electrode patterns 14B formed on.

In the same way as in the method of manufacturing the capacitor according to the first embodiment illustrated in FIGS. 4A to 4C, the aerosol deposition film 34 and the via conductors 38 buried in the aerosol deposition film 34 are formed above the copper foil 32.

Thus, a plurality of the copper foils 32 with the aerosol deposition film 34 with the via conductors 38 buried in are prepared.

Figure 11A:
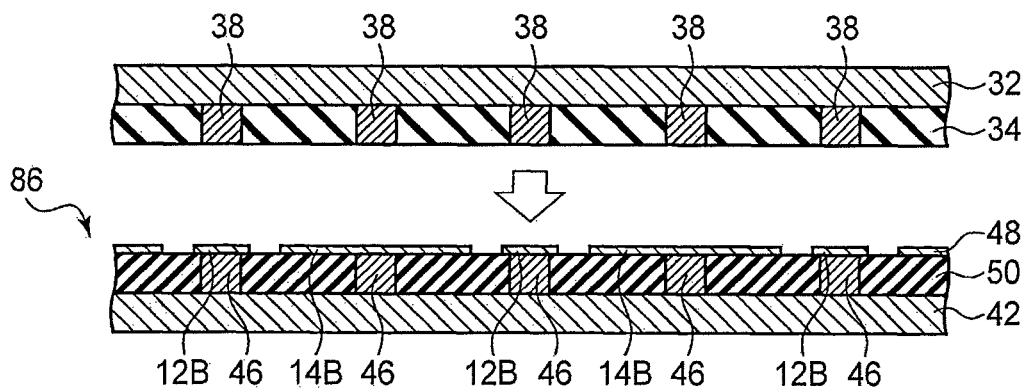
FIGS. 11A-11C and 12A-12C are cross-sectional views illustrating a method of manufacturing a capacitor according to a second embodiment.

Next, the copper foils 32 with the aerosol deposition film 34 formed are superposed above the copper foil 42 with the barium titanate film 50 and the copper film 48 formed with the via patterns 12B and the electrode patters 14B connected to the via conductors 38 (FIG. 11A).

Figure 11B:
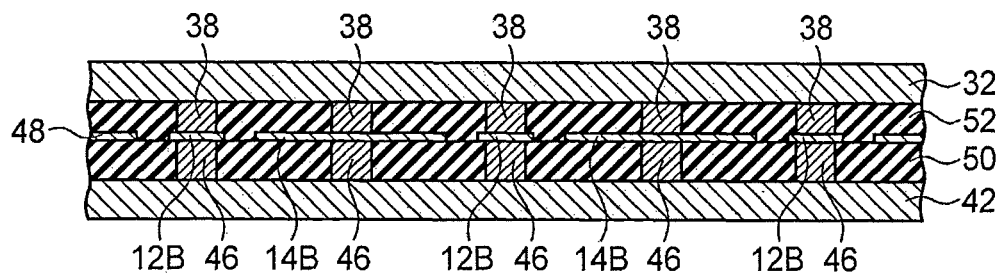

Then, while a pressure is being applied between the copper foil 42 and the copper foil 32, thermal processing is made in, e.g., a nitrogen atmosphere and at about 800° C.-1050° C., e.g., 1000° C. for 30 minutes to anneal the aerosol deposition film 34 to form the barium titanate film 52, and the barium titanate films 50, 52 are jointed (FIG. 11B). For the integration annealing, a compound layer for facilitating the joint may be formed between the barium titanate film 50 and the aerosol deposition film 34.

Figure 11C:
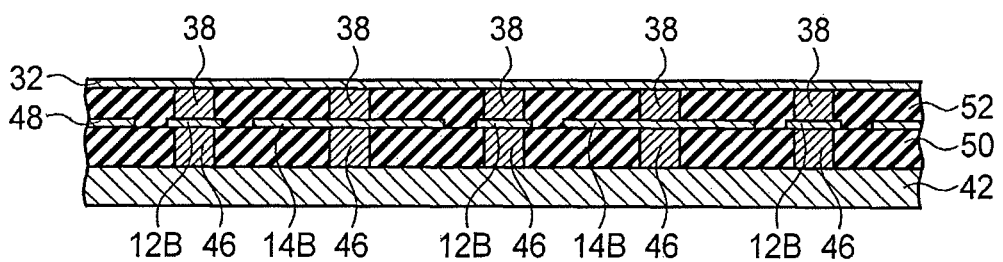

Then, the copper foil 32 is half-etched to an about 1 µm-thickness with, e.g., ferric chloride aqueous solution (FIG. 11C).

Figure 12A:
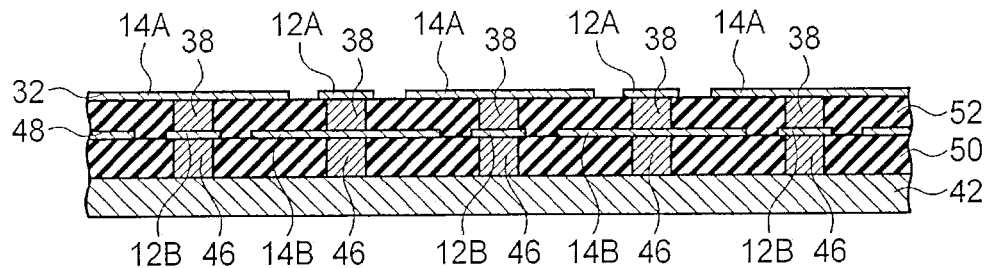
Figure 12B:
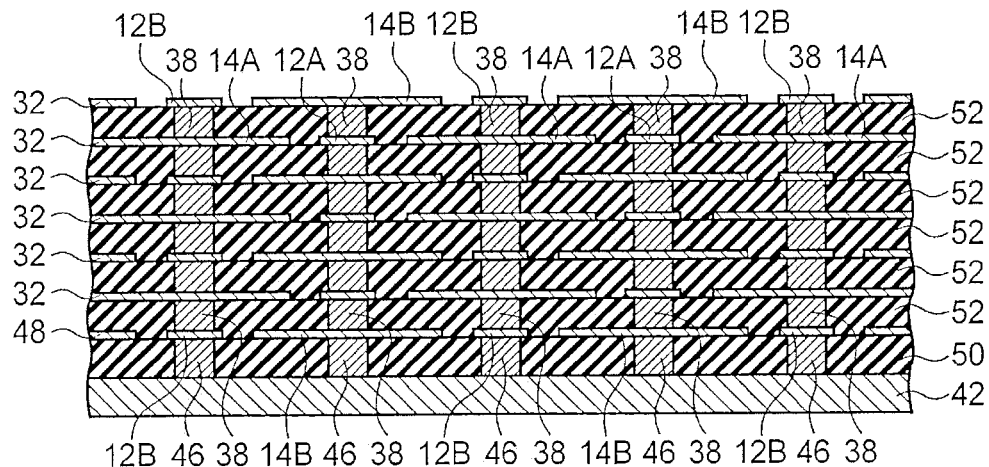

Next, the thinned copper foil 32 is patterned by photolithography and dry etching to form the via patterns 12A and the electrode patterns 14A connected to the via conductors 38 (FIG. 12A).

Next, in the same way as in the steps of FIGS. 11A to 12A, the joint of the copper foil 32 with the aerosol deposition film 34 formed and the patterning of the copper foil 32 are repeated. Thus, the copper foil 32 with the via patterns 12B and the electrode patterns 14B formed and the copper foil 32 with the via patterns 12A and the electrode patterns 14A formed are stacked with the barium titanate films 52 formed therebetween (FIG. 12B).

Figure 12C:
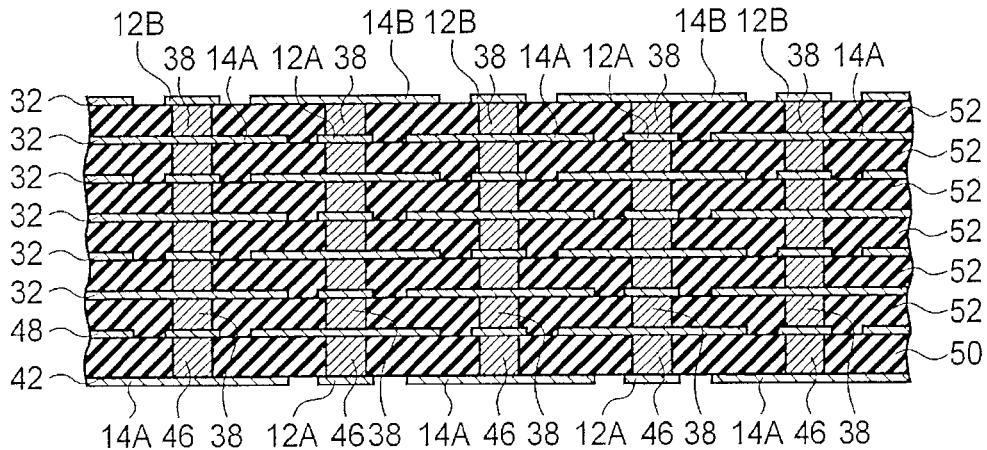

Then, in the same way as in the method of manufacturing the capacitor according to the first embodiment illustrated in FIGS. 7A to 7C, the copper foil 42 is half-etched and patterned to form the via patterns 12A and the electrode patterns 14A connected to the via conductors 46 (FIG. 12C).

Thus, the capacitor according to the first embodiment illustrated in FIG. 1 is completed.

As described above, according to the present embodiment, the capacitor is formed by stacking a plurality of substrates each including a barium titanate film deposited by aerosol deposition method and an electrode layer, whereby the annealing temperature can be lowered, and the stress accompanying the annealing can be suppressed. Consequently, the internal interconnections can be formed of a metal material of low resistance, such as copper or others, and the impedance and the inductance can be decreased. The stacked layer number can be easily increased, and the capacitance of the capacitor can be drastically increased.

A Third Embodiment

A capacitor and a method of manufacturing the capacitor according to a third embodiment will be described with reference to FIGS. 13A-13E. The same members of the present embodiment as those of the capacitor and the method of manufacturing the same according to the first and the second embodiments illustrated in FIGS. 1 to 12C are represented by the same reference numbers not to repeat or to simplify the description.

FIGS. 13A-13D are cross-sectional views illustrating the method of manufacturing the capacitor according to the present embodiment.

In the present embodiment, further another method of manufacturing the capacitor according to the first embodiment illustrated in FIG. 1 will be described.

Figure 13A:
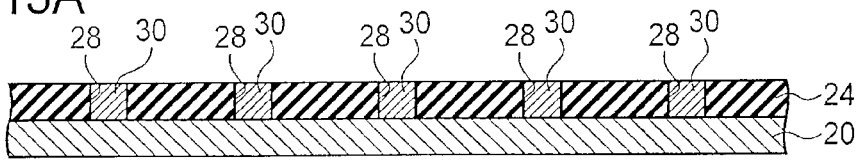
FIGS. 13A-13E are cross-sectional views illustrating a method of manufacturing a capacitor according to a third embodiment.

In the same way as in the method of manufacturing the capacitor according to the first embodiment illustrated in FIGS. 3A to 3E, the barium titanate film 24 with the via conductors 30 buried in is formed above the copper foil 20 (FIG. 13A). The barium titanate film 24 can be the aerosol deposition film 22 before the thermal processing.

In the same way as in the method of manufacturing the capacitor according to the first embodiment illustrated in FIGS. 4A to 4E, the aerosol deposition film 34 with the via conductors 38 buried in, and the copper film 40 including the via patterns 12A and the electrode patterns 14A are formed above the copper foil 32.

Then, the copper foil 32 is removed by, e.g., ferric chloride aqueous solution.

Figure 13B:
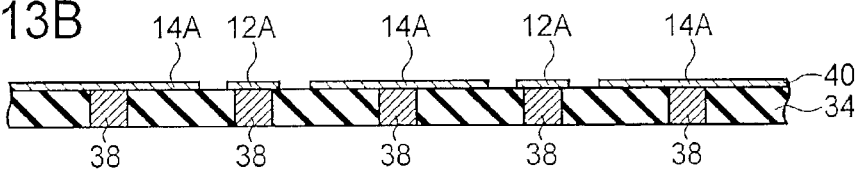

Thus, a plurality of the aerosol deposition films 34 with the via conductors 38 buried in and the copper film 40 formed on, which includes the via patterns 12A and the electrode patterns 14A connected to the via conductors 38, are prepared (FIG. 13B).

In the same way as in the method of manufacturing the capacitor according to the first embodiment illustrated in FIGS. 4A to 4D, the aerosol deposition film 44 with the via conductors 46 buried in, and the copper film 48 including the via patterns 12B and the electrode patterns 14B are formed above the copper foil 42.

Next, the copper foil 42 is removed by, e.g., ferric chloride aqueous solution.

Figure 13C:
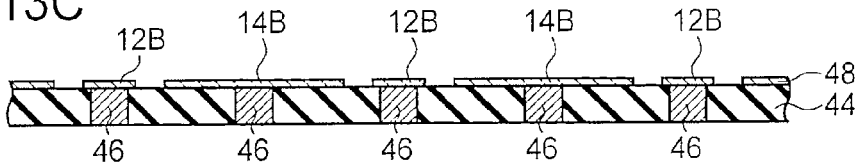

Thus, a plurality of the aerosol deposition films 44 with the via conductors 46 buried in and the copper film 48 formed on, which includes the via patterns 12B and the electrode patterns 14B connected to the via conductors 46, are prepared (FIG. 13C).

Next, the prepared aerosol deposition films 44 and the aerosol deposition films 34 are alternately stacked above the copper foil 20 with the barium titanate film 24 formed on with the via patterns and the electrode patterns aligned with the via conductors in the lower layers.

Figure 13D:
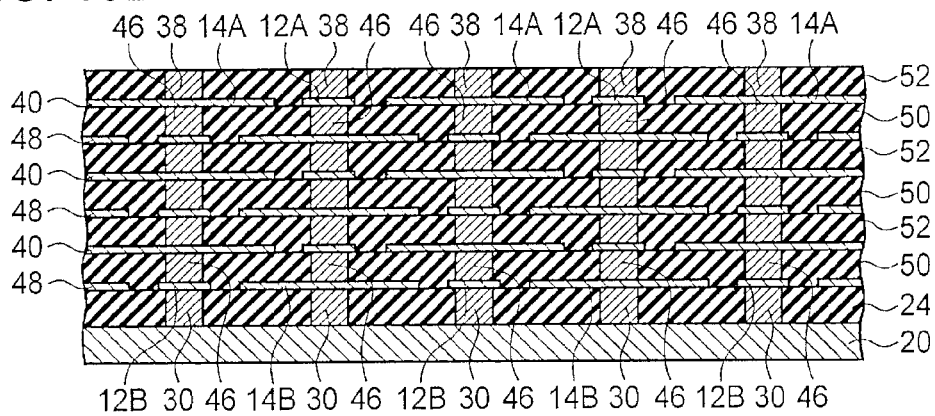

Next, while a pressure is being applied to thus-formed layer structure, thermal processing is made in, e.g., a nitrogen atmosphere and at about 800° C.-1050° C., e.g., 1000° C. for 30 minutes to anneal the aerosol deposition films 34, 44 to form the barium titanate films 50, 52 and the layer structure is integrated (FIG. 13D). For the integration annealing, a compound layer for facilitating the joint may be formed between the aerosol deposition films 34, 44.

Figure 13E:
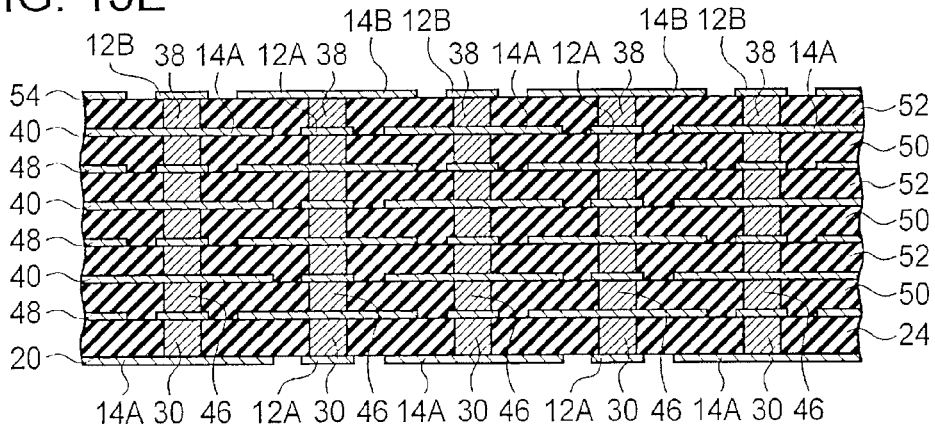

In the same way as in the method of manufacturing the capacitor according to the first embodiment illustrated in FIGS. 7A to 7C, the copper film including the via patterns 12B and the electrode patterns 14B is formed. The copper film 20 is thinned to form the via patterns 12A and the electrode patterns 14A (FIG. 13E).

In this case, the copper foil parts to be the base of the barium titanate films or the aerosol depositions films are removed by etching, but it is possible that the copper foil parts is thinned by etching, and the patterns to be the via patterns and the electrode patterns are formed.

Thus, the capacitor according to the first embodiment illustrated in FIG. 1 is completed.

As described above, according to the present embodiment, the capacitor is formed by stacking a plurality of substrates each including a barium titanate film deposited by aerosol deposition method and an electrode layer, whereby the annealing temperature can be lowered, and the stress accompanying the annealing can be suppressed. Consequently, the internal interconnections can be formed of a metal material of low resistance, such as copper or others, and the impedance and the inductance can be decreased. The stacked layer number can be easily increased, and the capacitance of the capacitor can be drastically increased. The whole layer structure is subjected to the thermal processing at once, which drastically simplifies the manufacturing process.

A Fourth Embodiment

An electronic device and a method of manufacturing an electronic device according to a fourth embodiment will be described with reference to FIGS. 14A to 15C. The same members of the present embodiment as those of the capacitor and the method of manufacturing the same according to the first to the third embodiments illustrated in FIGS. 1 to 13E are represented by the same reference numbers not to repeat or to simplify the description.

FIGS. 14A-15C are cross-sectional views illustrating the method of manufacturing the electronic device according to the present embodiment.

In the present embodiment, one example of the method of manufacturing an interposer with the capacitor according to the first to the third embodiments mounted will be described.

Figure 14A:
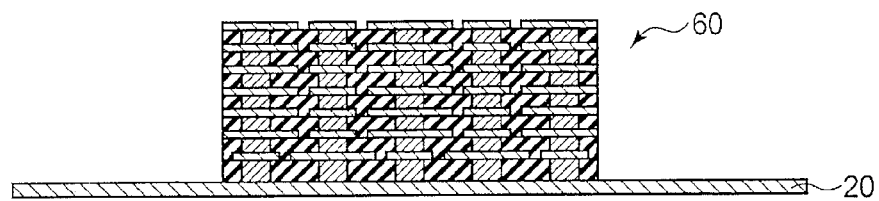
FIGS. 14A-14D and 15A-15C are cross-sectional views illustrating a method of manufacturing an electronic device according to a fourth embodiment.

First, in the same way as in the method of manufacturing the capacitor according to, e.g., the first embodiment illustrated in FIGS. 3A to 7A, the capacitor 60 is formed above the copper foil 20 (FIG. 14A). In the present embodiment, the capacitor 60 is formed above the copper foil 20 in a prescribed region thereof.

Figure 14B:
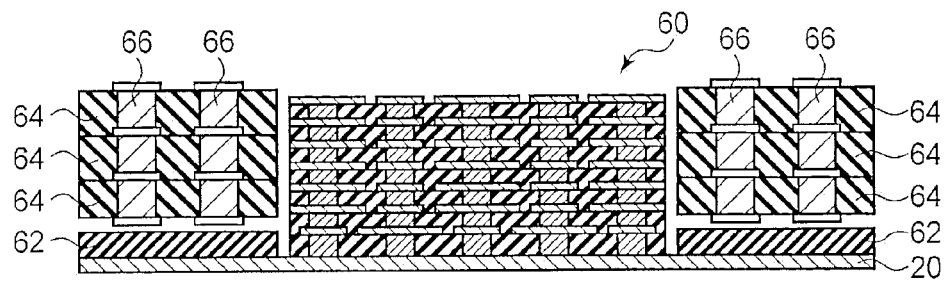

Next, an interconnection board 64 with through-vias 66 formed in is mounted on the copper foil 20 with the capacitor 60 formed on with a prepreg 62 therebetween (FIG. 14B). The part of the interconnection board 64 corresponding to the region for the capacitor 60 to be formed in is opened, and in this opening, the capacitor 60 is to be inserted.

Figure 14C:
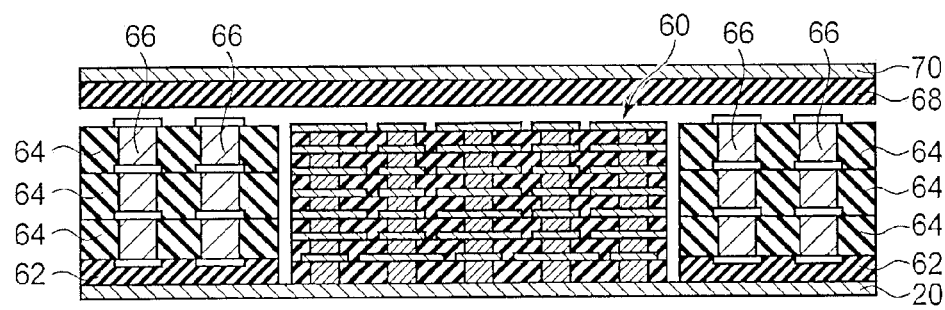

Next, a copper foil 70 with a prepreg 68 formed on is superposed above the copper foil 20 with the interconnection board 64 formed on (FIG. 14C). In place of the copper foil 70 with the prepreg 68 formed on, a prepreg without the copper foil may be used.

Figure 14D:
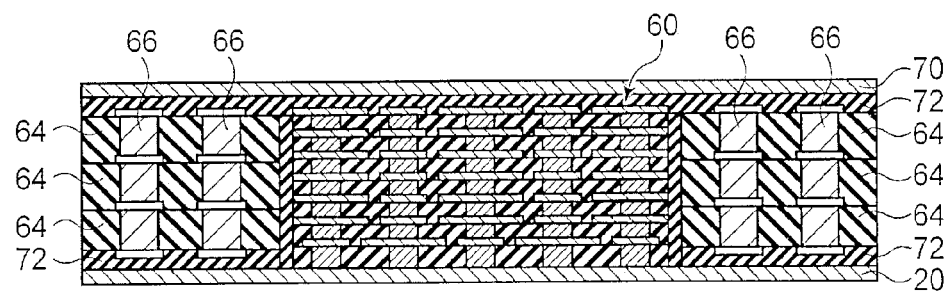

Then, thermal processing is made while a pressure is being applied between the copper foil 20 and the copper foil 70 to fill the gaps among the copper foil 20, the capacitor 60, the interconnection board 64 and the copper foil 70 with the prepregs 62, 68, and to form an insulating layer 72 by annealing and integrate the whole (FIG. 14D).

Figure 15A:
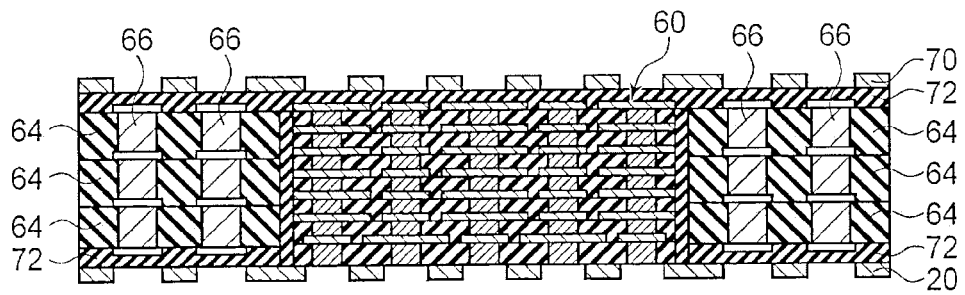

Then, the copper foils 20, 70 are processed into a prescribed pattern by photolithography and dry etching (FIG. 15A).

Figure 15B:
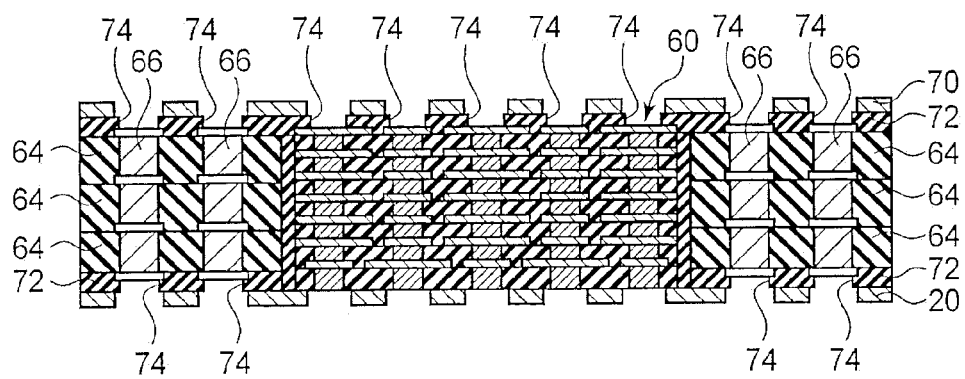

Next, via holes 74 to be connected to the through-vias 66 and the electrodes of the capacitor are formed in the insulating film 72 by photolithography and dry etching (FIG. 15B).

Figure 15C:
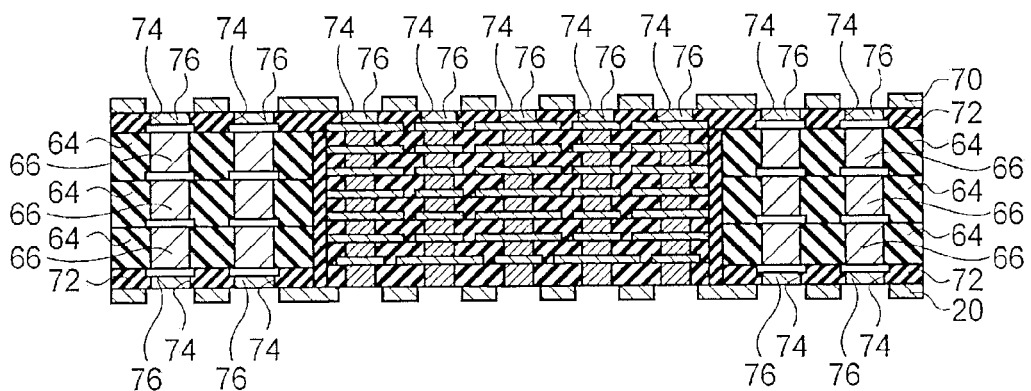

Next, via conductor 76 are filled in the via holes 74 by, e.g., plating method (FIG. 15C).

The copper foils remaining on the upper and lower surfaces may be removed by etching.

Thus, the interposer with the capacitor mounted is completed.

As described above, according to the present embodiment, the interpose with the capacitor of a large capacitance, a low impedance and low inductance and high reliability mounted can be formed.

A Fifth Embodiment

An electronic device and a method of manufacturing an electronic device according to a fifth embodiment will be described with reference to FIGS. 16A to 17B. The same members of the present embodiment as those of the capacitor and method of manufacturing the same according to the first to the third embodiments illustrated in FIGS. 1 to 13E are represented by the same reference numbers not to repeat or to simplify the description.

FIGS. 16A to 17B are cross-sectional views illustrating the method of manufacturing the electronic device according to the present embodiment.

In the present embodiment, another example of the method of manufacturing the interposer with the capacitor according to the first to the third embodiment mounted will be described.

Figure 16A:
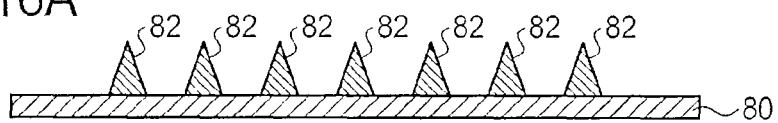
FIGS. 16A-16E and 17A-17B are cross-sectional views illustrating a method of manufacturing an electronic device according to a fifth embodiment.

First, by, e.g., screen printing method, conductive bumps 82 are formed above a copper foil 80 (FIG. 16A).

Then, a prepreg 84 of an insulating material is stacked above the copper foil 80 with conductive bumps 82 formed on with the tops of the conductive bumps 82 projected therefrom.

Figure 16B:
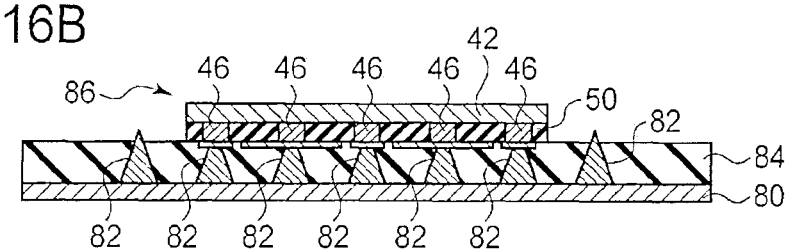

Next, a basic structure 86 of the capacitor illustrated in, e.g., FIG. 11A is stacked above the prepreg 84 with the tops of the conductive bumps 82 projected therefrom with the conductive bumps 82 and the electrode layer 48 connected to each other (FIG. 16B).

Then, the copper foil 42 is thinned by half etching, and then the thinned copper foil 42 is patterned to form the via patterns 12A and the electrode patterns 14A.

Figure 16C:
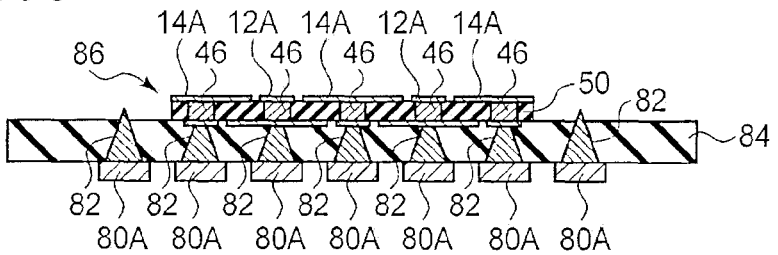

Next, the copper foil 80 is patterned to form electrode patterns 80A (FIG. 16C).

Figure 16D:
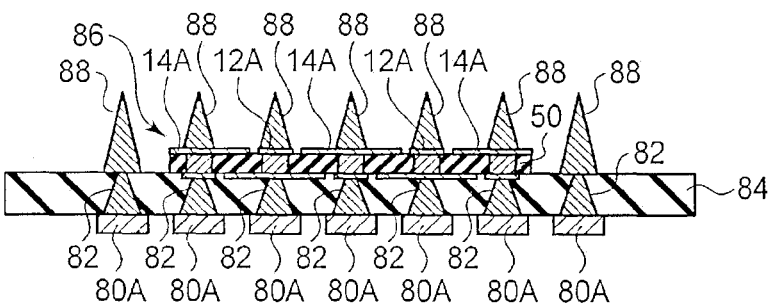
Figure 16E:
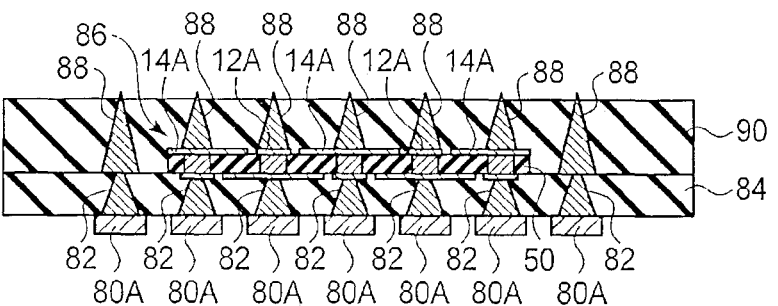

Next, conductive bumps 88 are formed above the prepreg 84 with the basic structure 86 of the capacitor mounted by, e.g., screen printing method (FIG. 16D).

Next, a prepreg 90 of an insulating material is stacked above the prepreg 84 with the conductive bumps 88 formed on and above the basic structure 86 of the capacitor with the tops of the conductive bumps 88 projected therefrom.

Figure 17A:
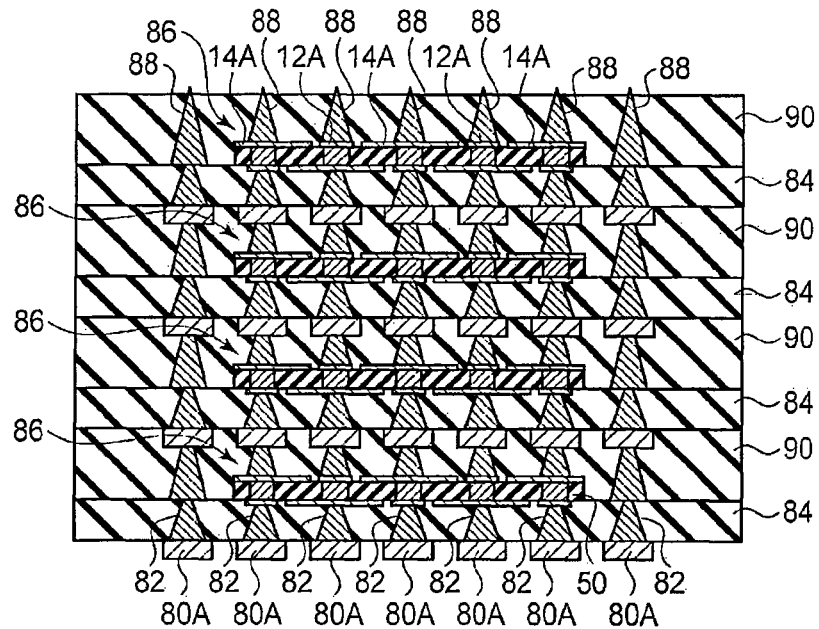

Next, a plurality of the layer structures thus formed are stacked (FIG. 17A).

Then, a copper foil is deposited above the uppermost prepreg 90, and the whole is cured and integrated.

Figure 17B:
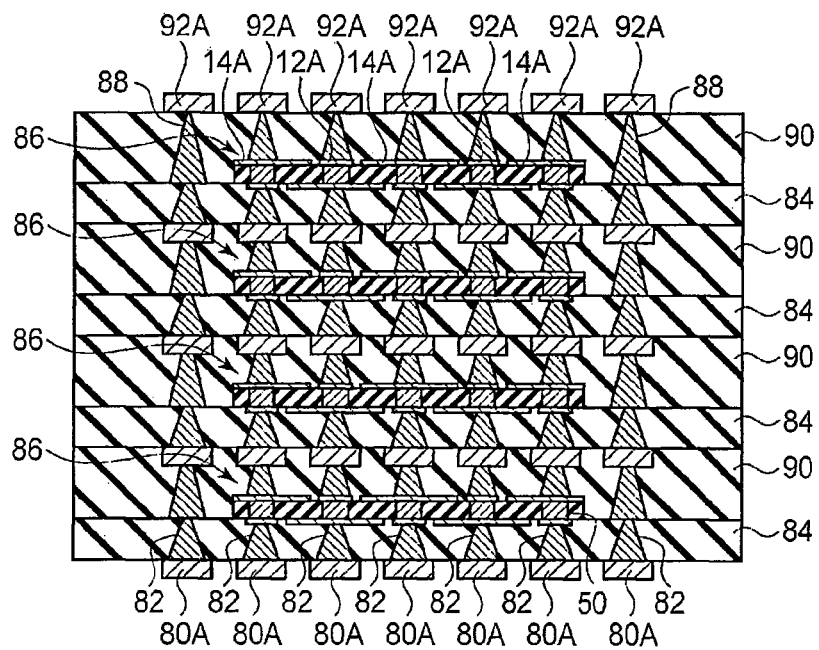

Then, the uppermost copper foil is patterned to form electrode patterns 92A (FIG. 17B).

Thus, the interposer with the capacitor mounted is completed.

As described above, according to the present embodiment, the interpose with the capacitor of a large capacitance, a low impedance and low inductance and high reliability mounted can be formed.

A Sixth Embodiment

An electronic device according to a sixth embodiment will be described with reference to FIGS. 18 and 19. The same members of the present embodiment as those of the capacitor and the method of manufacturing the same according to the first to the third embodiments illustrated in FIGS. 1 to 13E and those of the electronic device and the method of manufacturing the same according to the fourth and the fifth embodiments illustrated in FIGS. 14A to 17B are represented by the same reference numbers not to repeat or to simplify the description.

Figure 18:
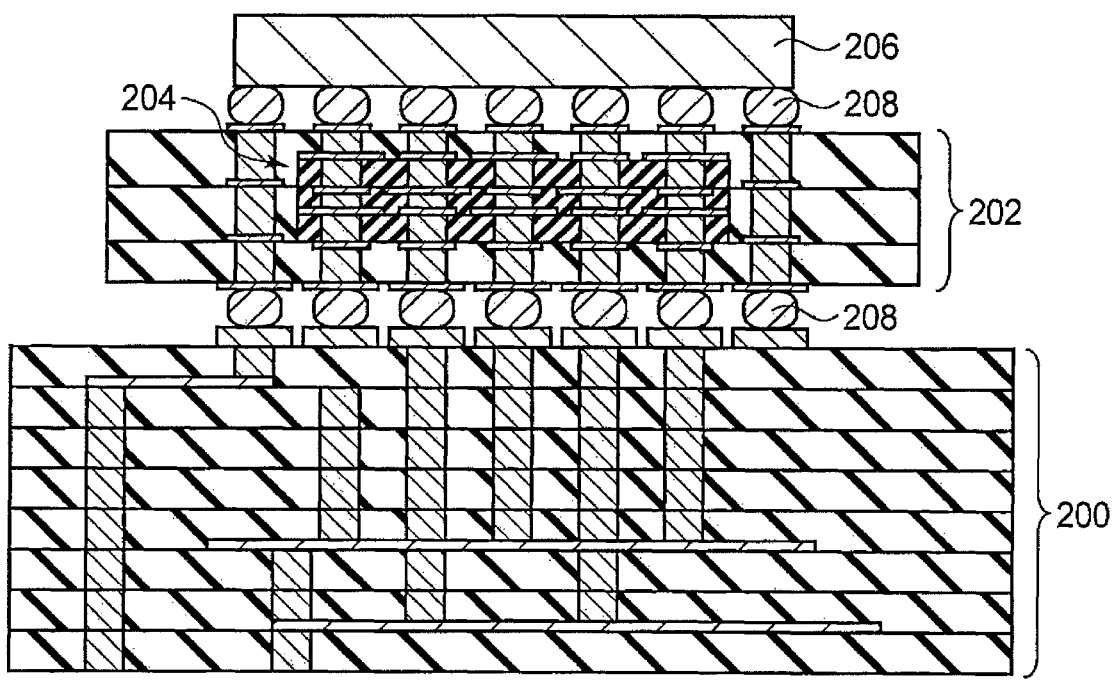
FIGS. 18 and 19 are diagrammatic cross-sectional views illustrating structures of an electronic device according to a sixth embodiment.
Figure 19:
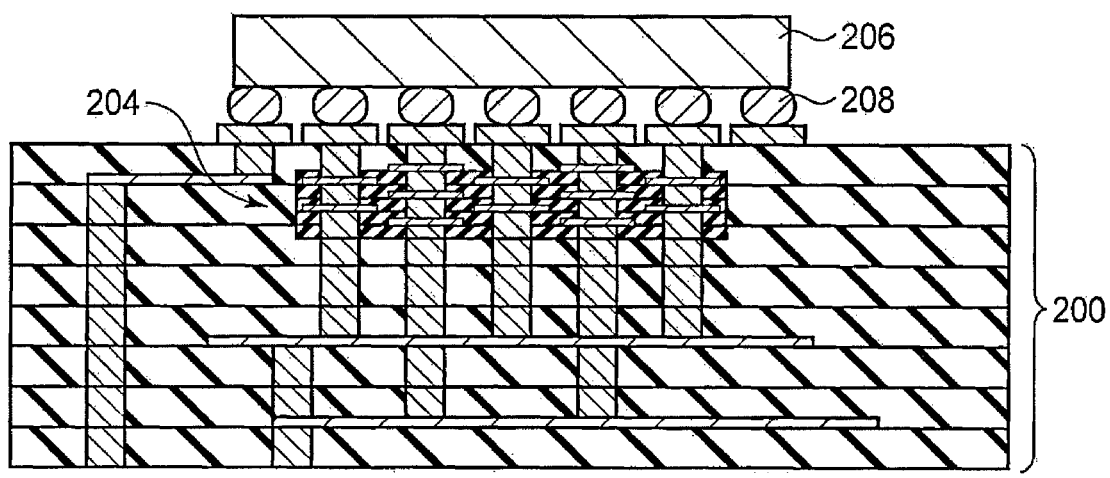

FIGS. 18 and 19 are diagrammatic sectional views of the electronic device according to the present embodiment in the steps of the method of manufacturing the electronic device, which illustrate the method.

In the electronic device illustrated in FIG. 18, a semiconductor element 206 mounted on a multilayered circuit board 200 via an interposer 202 with a capacitor 204 mounted. As the interposer 202, the interposer according to, e.g., the fourth or the fifth embodiment can be used. The multilayered circuit board 200 and the interposer 202, and the interposer 202 and the semiconductor element 206 are respectively connected to each other by projected electrodes 208, such as solder bumps or others. The capacitor 204 mounted in the interposer 202 can be used, e.g., as the decoupling capacitor of the power source circuit connected to the semiconductor element 206.

By the same manufacturing process as the manufacturing method according to the fourth or the fifth embodiment, as exemplified in FIG. 19, the capacitor 204 can be mounted in the multilayered circuit board 200. In this case as well, the capacitor 204 mounted in the multilayered circuit board 200 can be used, e.g., as the decoupling capacitor of the power source circuit connected to the semiconductor element 206.

As described above, the capacitor according to the first to the third embodiments allows the internal interconnections to be formed of a metal material of low resistance, such as copper or others. By increasing the layer number, the capacitance can be easily increased. Thus, the capacitor of a high capacitance and a low inductance and impedance can be realized. The through-via structure allows the lead lines from the capacitor electrodes to be easily connected to the top and the bottom of the capacitor.

Thus, the interposer 202 and the multilayered circuit board 200 with the capacitor 60 according to the first to the third embodiments mounted is formed, whereby the interconnection length between the capacitor 204 and the semiconductor element 206 can be shortened. Thus, for example, the impedance of the decoupling capacitor and the power supply system can be suppressed low, and the electronic device can have high performance.

As described above, according to the present embodiment, the electronic device with the capacitor of a high capacitance, a low impedance and inductance, and high reliability mounted can be formed.

Modified Embodiments

The above-described embodiments can cover other various modifications.

For example, in the first embodiment described above, the aerosol deposition films 34, 44 are formed above the copper foils 32, 42. However, the substrate as the base of the aerosol deposition films 34, 44 is not essentially the copper foils 32, 42. The base substrate can be any as long as the base substrate is durable at least to the annealing temperature of the aerosol deposition films 33, 44. Preferably, the base substrate has conductivity when the via conductors 38, 46 are formed of electroplating, but may not have conductivity when the via conductors 38, 46 are formed by another method, such as sputtering method or others.

In the fifth embodiment described above, the basic structures 86 of the capacitor are stacked via the conductive bumps, but the capacitor including two or more layers of the basic structures 86 of the capacitor stacked may be stacked with the conductive bumps therebetween.

The structures and the manufacturing methods of the interposer and the multilayered circuit board with the capacitor mounted are not limited to the structures and the manufacturing methods illustrated in FIGS. 14A to 19B and can be suitably changed as required.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

EXAMPLES

Example 1

A thin film multilayered capacitor was formed by the method of manufacturing the capacitor according to the first embodiment.

The film thickness of the barium titanate film was 1 µm, and the stacked layer number was 20 layers. The diameter of the vias interconnecting the electrode layers was 50 µm, the via pitch was 150 µm. The stacked layer number was examined, and it has been found that about 50 layers can be stacked.

The dielectric constant of the barium titanate film measured on the capacitor of the multilayered structure formed by the above method was about 1500. The capacitance per a unit area was 26 µF/cm$^2$. The inductance of the capacitor was about 3 pH.

HAST (Highly Accelerated temperature and humidity Stress Test) reliability evaluation was conducted for 168 hours in an environment at the temperature of 130° C. and the humidity of 85% with 3.5 V applied between the electrodes, and the reliability had no problem.

Example 2

A thin film multilayered capacitor was formed by the same process of Example 1 except that when the aerosol deposition film is stacked on the barium titanate film, a LiF powder of a 100 nm-thickness is applied to the interface by aerosol deposition method.

The film thickness of the barium titanate film was 1 µm, and the stacked layer number was 20 layers. The diameter of the vias interconnecting the electrode layers was 50 µm, the via pitch was 150 µm. The stacked layer number was examined, and it has been found that about 50 layers can be stacked.

The dielectric constant of the barium titanate film measured on the capacitor of the multilayered structure formed by the above method was about 1000. The capacitance per a unit area was 17 µF/cm$^2$. The inductance of the capacitor was about 3 pH.

HAST reliability evaluation was conducted for 168 hours in an environment at the temperature of 130° C. and the humidity of 85% with 3.5 V applied between the electrodes, and the reliability had no problem.

Example 3

A thin film multilayered capacitor was formed by the method of manufacturing the capacitor according to the third embodiment.

The film thickness of the barium titanate film was 1 µm, and the stacked layer number was 50 layers. The diameter of the vias interconnecting the electrode layers was 50 µm, the via pitch was 150 µm. The stacked layer number was examined, and it has been found that about 100 layers can be stacked.

The dielectric constant of the barium titanate film measured on the capacitor of the multilayered structure formed by the above method was about 1500. The capacitance per a unit area was 65 µF/cm$^2$. The inductance of the capacitor was about 3 pH.

HAST reliability evaluation was conducted for 168 hours in an environment at the temperature of 130° C. and the humidity of 85% with 3.5 V applied between the electrodes, and the reliability had no problem.

Example 4

A thin film multilayered capacitor was formed by the same process of Example 3 except that when the aerosol deposition film is stacked on the barium titanate film, a LiF powder of a 50 nm-thickness is applied to the interface by aerosol deposition method.

The film thickness of the barium titanate film was 1 µm, and the stacked layer number was 50 layers. The diameter of the vias interconnecting the electrode layers was 50 µm, the via pitch was 150 µm. The stacked layer number was examined, and it has been found that about 100 layers can be stacked.

The dielectric constant of the barium titanate film measured on the capacitor of the multilayered structure formed by the above method was about 1500. The capacitance per a unit area was 44 µF/cm$^2$. The inductance of the capacitor was about 3 pH.

HAST reliability evaluation was conducted for 168 hours in an environment at the temperature of 130° C. and the humidity of 85% with 3.5 V applied between the electrodes, and the reliability had no problem.

[Reference 1]

An electrode of Ti/Pt structure was formed on a silicon wafer by sputtering method.

Next, onto the electrode, alkoxide liquid adjusted to barium titanate composition is applied, and a sol-gel film of a 300 nm-thickness was formed.

Then, thermal processing of 30 minutes was made in an oxygen-content atmosphere at 600° C. to remove the liquid component of the sol-gel film, and a barium titanate film was formed.

Then, the formation of a Pt electrode and the formation of the barium titanate film were repeatedly made, and the thin film multilayered capacitor was formed. The diameter of the vias interconnecting the electrode layers was 50 µm, and the via pitch was 150 µm.

A capacitor of the multilayered structure was formed by the above method, and due to the occurrence of the thermal shrinkage and thermal stresses of the sol-gel film, cracks were generated in the barium titanate film. Three dielectric layers at most could be stacked.

The dielectric constant of the barium titanate film measured on the capacitor of the multilayered structure formed by the above method was about 400. The capacitance per a unit area was 3.5 µF/cm$^2$. The inductance of the capacitor was 10 pH.

HAST reliability evaluation was conducted for 168 hours in an environment at the temperature of 130° C. and the humidity of 85% with 3.5 V applied between the electrodes, and leakage current due to the cracks in the barium titanate film is observed.

In this method, annealing in an atmosphere containing oxygen, such as oxygen annealing, atmospheric annealing or others, is necessary, and as the electrode layer, Pt, whose oxidation-resistance is high, is used.

[Reference 2]

A thin film multilayered capacitor was formed by the same method as in Reference 1 except that the barium titanate film was formed by sputtering method.

The barium titanate film was deposited by sputtering method with the target adjusted to the barium titanate composition and then crystallized by making thermal processing in an atmosphere containing oxygen, at 600° C. for 30 minutes. The film thickness of the barium titanate film was 200 nm. The diameter of the vias interconnecting the electrode layers was 50 µm, and via pitch was 150 µm.

A capacitor of the multilayered structure was formed by the above method, and due to generation of thermal shrinkage and thermal stresses generated in the crystallization, cracks were generated in the barium titanate film, and 3 layers of the dielectric layers at most were stacked.

The dielectric constant of the barium titanate film measured on the capacitor of the multilayered structure formed by the above method was about 350. The capacitance per a unit area was 4.5 µF/cm². The inductance of the capacitor was 10 pH.

HAST reliability evaluation was conducted for 168 hours in an environment at the temperature of 130° C. and the humidity of 85% with 3.5 V applied between the electrodes, and leakage current due to the cracks in the barium titanate film is observed.

In this method, annealing in an atmosphere containing oxygen, such as oxygen annealing, atmospheric annealing or others, is necessary, and as the electrode layer, Pt, whose oxidation-resistance is high, is used.

[Reference 3]

Via holes were formed in a barium titanate green sheet, and Ni paste was filled in the via holes. An electrode pattern was screen-printed with Ni paste on the surface of the green sheet. The diameter of the vias interconnecting the electrode layers was 100 µm, and the via pitch was 350 µm.

Next, the green sheets of Pattern G and Pattern V thus formed were alternately stacked and integrated.

Next, thermal processing of 30 minutes was made at 1350° C. to anneal this layer structure, and a thin film multilayered capacitor was formed.

The film thickness of the barium titanate film was 5 µm, and the stacked layer number was 20 layers. The stacked layer number was examined, and it has been found that about 100 layers can be stacked.

The dielectric constant of the barium titanate film measured on the capacitor of the multilayered structure formed by the above method was about 3000. The capacitance per a unit area was 10 µF/cm². The inductance of the capacitor was 8 pH.

HAST reliability evaluation was conducted for 168 hours in an environment at the temperature of 130° C. and the humidity of 85% with 3.5 V applied between the electrodes, and the reliability had no problem.

However, this method using screen print cannot downsize the via diameter and the via pitch. The electrodes must be formed of a material which is durable to the annealing temperature of the barium titanate green sheet, and Ni, which is a refractory metal, is used here.

What is claimed is:

1. A method of manufacturing a capacitor comprising:
   forming, above a first metal foil, a first dielectric film of a ceramic material containing barium oxide by blowing dry ceramic particles to the first metal foil from a nozzle;
   forming, in the first dielectric film, a first via conductor connected to the first metal foil and a second via conductor connected to the first metal foil;
   forming, above the first dielectric film, a first electrode pattern connected to the first via conductor; and
   patterning the first metal foil to form a second electrode pattern connected to the second via conductor, wherein forming the first electrode pattern includes:
      forming, above a second metal foil, a second dielectric film of a ceramic material containing barium oxide by blowing dry ceramic particles to the second metal foil from a nozzle;
      forming, in the second dielectric film, a third via conductor connected to the second metal foil and a fourth via conductor connected to the second metal foil;
      forming, above the second dielectric film, the first electrode pattern connected to the third via conductor; and
      jointing the first dielectric film and the second dielectric film with the first via conductor and the first electrode pattern connected to each other and with the second via conductor and the fourth via conductor connected to each other.

2. The method of manufacturing a capacitor according to claim 1, further comprising, after forming the first electrode pattern,
   forming a third electrode pattern connected to the fourth via conductor.

3. The method of manufacturing a capacitor according to claim 2, wherein
   forming the third electrode pattern includes:
      removing the second metal foil; and
      forming the third electrode pattern above the second dielectric film.

4. The method of manufacturing a capacitor according to claim 2, wherein
   in forming the third electrode pattern, the second metal foil is patterned to form the third electrode pattern.

5. The method of manufacturing a capacitor according to claim 1, wherein
   the first metal foil, the first via conductor, the second via conductor and the first electrode pattern are formed of copper.

6. A method of manufacturing a capacitor comprising:
   forming a plurality of first substrates each including a first dielectric film with a first via conductor and a second via conductor buried in and a first electrode pattern connected to the first via conductor by
      forming, above a first metal foil, the first dielectric film of a ceramic material containing barium oxide by blowing dry ceramic particles to the first metal foil from a nozzle;
      forming, in the first dielectric film, the first via conductor connected to the first metal foil and the second via conductor connected to the first metal foil;
      forming, above the first dielectric film, the first electrode pattern connected to the first via conductor; and
      removing the first metal foil;
   forming a plurality of second substrates each including a second dielectric film with a third via conductor and a fourth via conductor buried in and a second electrode pattern connected to the third via conductor by forming, above a second metal foil, the second dielectric film of a ceramic material containing barium oxide by blowing dry ceramic particles to the first metal foil from a nozzle;

forming, in the second dielectric film, the third via conductor connected to the second metal foil and the fourth via conductor connected to the second metal foil;

forming, above the second dielectric film, the second electrode pattern connected to the third via conductor; and removing the second metal foil; and repeatedly stacking the first substrate and the second substrate with the first electrode pattern connected alternately to the first via conductor and the fourth via conductor and with the second electrode pattern alternately connected to the third via conductor and the second via conductor.

7. The method of manufacturing a capacitor according to claim 6, further comprising:

making thermal processing at a temperature lower than melting points of the materials of the first via conductor, second via conductor, third via conductor, fourth via conductor, the first electrode pattern and the second electrode pattern to anneal the first dielectric films and the second dielectric films and integrate the plural first substrates and the plural second substrate stacked.

8. The method of manufacturing a capacitor according to claim 6, wherein the first metal foil, the second metal foil, the first via conductor, the second via conductor, the third via conductor, the fourth via conductor, the first electrode pattern and the second electrode pattern are formed of copper.

9. The method of manufacturing a capacitor according to claim 6, wherein in forming the first dielectric film, the first dielectric film is formed by jetting to the first metal foil an aerosol containing material particles having surfaces reformed in an amorphous layer and containing no liquid, and in forming the second dielectric film, the second dielectric film is formed by jetting to the second metal foil an aerosol containing material particles having surfaces reformed in an amorphous layer and containing no liquid.

10. A method of manufacturing a capacitor comprising:

forming, above a first metal foil, a first dielectric film of a ceramic material containing barium oxide by blowing dry ceramic particles to the first metal foil from a nozzle;

forming, in the first dielectric film, a first via conductor connected to the first metal foil and a second via conductor connected to the first metal foil;

forming, above the first dielectric film, a first electrode pattern connected to the first via conductor; and patterning the first metal foil to form a second electrode pattern connected to the second via conductor, wherein the method further comprising making a thermal processing to anneal the dielectric film at a temperature lower than melting points of the materials of the first metal foils, the first via conductor, the second via conductor and the first electrode pattern.

11. A method of manufacturing a capacitor comprising:

forming, above a first metal foil, a first dielectric film of a ceramic material containing barium oxide by blowing dry ceramic particles to the first metal foil from a nozzle;

forming, in the first dielectric film, a first via conductor connected to the first metal foil and a second via conductor connected to the first metal foil;

forming, above the first dielectric film, a first electrode pattern connected to the first via conductor; and patterning the first metal foil to form a second electrode pattern connected to the second via conductor, wherein in forming the first dielectric film, the first dielectric film is formed by jetting to the first metal foil an aerosol containing material particles having surfaces reformed in an amorphous layer and containing no liquid.

* * * * *